United States Patent
Oyu

(10) Patent No.: US 9,905,741 B2
(45) Date of Patent: Feb. 27, 2018

(54) LIGHT EMITTING DEVICE AND MANUFACTURING METHOD THEREOF

(71) Applicant: NICHIA CORPORATION, Anan-shi, Tokushima (JP)

(72) Inventor: Takahiro Oyu, Chiyoda-ku (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 14/191,604

(22) Filed: Feb. 27, 2014

(65) Prior Publication Data
US 2014/0239318 A1    Aug. 28, 2014

(30) Foreign Application Priority Data

Feb. 28, 2013  (JP) ................. 2013-040148
Feb. 26, 2014  (JP) ................. 2014-035617

(51) Int. Cl.
| | |
|---|---|
| H01L 29/18 | (2006.01) |
| H01L 33/62 | (2010.01) |
| H01L 33/48 | (2010.01) |
| H01L 23/00 | (2006.01) |
| H05K 1/18 | (2006.01) |

(52) U.S. Cl.
CPC ............ *H01L 33/62* (2013.01); *H01L 24/18* (2013.01); *H01L 33/486* (2013.01); *H01L 2224/48091* (2013.01); *H01L 2224/73267* (2013.01); *H01L 2224/92244* (2013.01); *H01L 2924/01322* (2013.01); *H01L 2924/12041* (2013.01); *H01L 2924/12042* (2013.01); *H01L 2924/351* (2013.01); *H05K 1/189* (2013.01); *H05K 2201/10106* (2013.01)

(58) Field of Classification Search
CPC ........ H01L 33/46; H01L 33/62; H01L 27/153
USPC ......... 257/88, 91, 98, 99, E33.068, E33.057, 257/E33.066
See application file for complete search history.

(56) References Cited

U.S. PATENT DOCUMENTS

| | | |
|---|---|---|
| 6,281,524 B1 | 8/2001 | Yamamoto et al. |
| 6,340,824 B1 | 1/2002 | Komoto et al. |
| 2001/0024460 A1 | 9/2001 | Yamamoto et al. |
| 2002/0079506 A1 | 6/2002 | Komoto et al. |
| 2002/0088985 A1 | 7/2002 | Komoto et al. |
| 2004/0046242 A1 | 3/2004 | Asakawa |
| 2004/0252501 A1* | 12/2004 | Moriyama .......... F21V 19/0025 362/238 |
| 2005/0056852 A1 | 3/2005 | Suzuki et al. |

(Continued)

FOREIGN PATENT DOCUMENTS

| | | |
|---|---|---|
| CN | 101198216 A | 6/2008 |
| JP | H10-294493 A | 11/1998 |

(Continued)

*Primary Examiner* — Jamie C Niesz
(74) *Attorney, Agent, or Firm* — Foley & Lardner LLP

(57) ABSTRACT

The light emitting device including: a flexible substrate having a negative lead electrode and a positive lead electrode formed on an upper surface thereof; a light emitting element having a negative electrode and a positive electrode formed on an upper surface thereof; an insulating film formed on a side surface of the light emitting element; a wiring formed in contact with the insulating film for connecting between the negative electrode and the negative lead electrode, or between the positive electrode and the positive lead electrode.

18 Claims, 7 Drawing Sheets

(56) References Cited

U.S. PATENT DOCUMENTS

| | | | |
|---|---|---|---|
| 2005/0133796 A1* | 6/2005 | Seo | H01L 33/46 257/79 |
| 2005/0277216 A1 | 12/2005 | Asakawa | |
| 2006/0214255 A1 | 9/2006 | Suzuki et al. | |
| 2006/0292804 A1 | 12/2006 | Seo et al. | |
| 2009/0173963 A1 | 7/2009 | Hsu et al. | |
| 2010/0065859 A1 | 3/2010 | Suzuki et al. | |
| 2011/0284822 A1 | 11/2011 | Jung et al. | |
| 2013/0099666 A1* | 4/2013 | Stuffle | G09F 9/33 315/52 |
| 2013/0264603 A1* | 10/2013 | Lin | H01L 33/36 257/99 |
| 2014/0151633 A1 | 6/2014 | Jung et al. | |
| 2016/0351759 A1 | 12/2016 | Jung et al. | |

FOREIGN PATENT DOCUMENTS

| | | | |
|---|---|---|---|
| JP | H11-145519 A | 5/1999 | |
| JP | 2004-363537 A | 12/2004 | |
| JP | 2005-086134 A | 3/2005 | |
| JP | 2005-1893911 | 7/2005 | |
| JP | 2006-332688 A | 7/2006 | |
| JP | 2007-188955 A | 7/2007 | |
| JP | 2007-287849 | 11/2007 | |
| JP | 2011-243666 * | 12/2011 | H01L 33/62 |
| JP | 2011-243666 A | 12/2011 | |
| JP | 2011-243977 A | 12/2011 | |
| JP | 2012-059736 A | 3/2012 | |
| JP | 2012-091442 A | 5/2012 | |
| JP | 2012-142362 A | 7/2012 | |
| JP | 2013-008721 A | 1/2013 | |
| JP | 2013-016576 | 1/2013 | |

* cited by examiner

LIGHT EMITTING DEVICE AND MANUFACTURING METHOD THEREOF

BACKGROUND

Technical Field

The disclosure relates to a light emitting device with a light emitting element mounted thereon, and more particularly, to a light emitting device on which a light emitting element is mounted while its surface with electrodes is facing upward (hereinafter referred to as the face-up mounting type).

Description of Related Art

Semiconductor light emitting elements (hereinafter referred to as a "light emitting element"), such as a light emitting diode (LED) and a laser diode (LD), have the advantages of being small in size with a high power efficiency, emitting the vibrant colored light, having less possibility that a bulb will burn out because of the use of the semiconductor element, and having excellent initial driving characteristics and great resistance against repeated use, including vibration, and turning on/off.

As the light emitting element has such excellent advantages, the light emitting device with the light emitting element mounted as a light emitting source is used as a light source of a lighting equipment or a backlight of liquid crystal display (LCD) for general consumer use. Thus, the light emitting device is designed so as to be suitable for these uses.

For example, a light emitting device may be used which includes a light emitting element mounted on a wiring board (printed substrate) with patterns of lead electrodes formed of a metal film on the surface of a plate-like or film-like substrate. Mounting a semiconductor element (chip) on the wiring board involves mounting the semiconductor element in a predetermined mounting region of the wiring board, electrically connecting electrodes of the semiconductor element to the lead electrode (inner lead) on the wiring board. After the mounting, the semiconductor element may be sealed the semiconductor element with resin. The manner for mounting a semiconductor element is classified into a face-up mounting which includes placing the semiconductor element so as to cause its surface with at least one electrode (pad electrode) to face upward and forming a wiring (conductive line) for electrically connecting the pad electrode to the lead electrode, and a flip-chip mounting (face-down mounting) which includes mounting the semiconductor element while the pad electrodes are facing down and coupled to the lead electrodes.

In the face-up mounting, a wiring is normally formed by wire bonding.

At this time, a wire serving as the wiring is provided in an arc to have only its both ends bonded to the pad electrode of the semiconductor element and the lead electrode. Thus, in the wire bonding mounting, the wire sealed by resin together with the semiconductor element might be broken by a stress from the outside of the light emitting device and so on. On the other hand, in the flip-chip mounting, the lead electrodes on the wiring board need to be positioned facing to each other depending on the position of the pad electrode of the semiconductor element. Thus, the flip-chip mounting is not easy as compared to the wiring bonding mounting.

Accordingly, methods for mounting a face-up mounting type light emitting element on a wiring board without using wire bonding have been developed. For example, JP 2011-243666 A discloses a mounting method for connecting electrodes on the upper surface of a light emitting element to lead electrodes of a wiring board by printing a wiring with conductive ink. The conductive ink has been recently applied for formation of fine wirings, such as a wiring board, and can be printed on a surface with certain unevenness, especially, by an ink jet method. Thus, the use of the conductive ink can form wirings (die wires) from the electrodes on the upper surface of a chip of the light emitting element through the sides (end surfaces) of the chip to the wiring board which is a chip mounting surface.

In the mounting method disclosed in JP 2011-243666 A, a layer made of translucent resin, such as epoxy resin or urethane resin, is provided on the side surfaces of the light emitting element mounted on the wiring board, whereby the die wire formed of the conductive ink is insulated from a semiconductor layer of the light emitting element. In this structure, however, the die wire is sandwiched between a resin layer provided on the side surface of the light emitting element and the translucent resin for sealing the light emitting element. That is, the die wire is supported only by the resin, and as a result, might be broken in the same way as in the wiring bonding mounting.

Particularly, in use of the film-like flexible substrate as the wiring board, the wiring can be easily broken due to a bending stress of the flexible substrate. The resin layer provided on the side surface of the light emitting element is sandwiched between the light emitting element and the die wire having a high thermal conductivity. The resin layer is likely to be degraded by heat or light as the use of the light emitting device, and thus might reduce its translucency.

SUMMARY

The embodiments of the present invention are made in view of the foregoing drawbacks, and the embodiments of the present invention are directed to provide a light emitting device that can be applied to a face-up mounting type light emitting element and which has higher reliability than in the wire bonding mounting.

The inventor of the present application has found a light emitting device having the following structure.

According to a first aspect of the present invention, a light emitting device includes:

a flexible substrate with a negative lead electrode and a positive lead electrode formed on an upper surface thereof;

a light emitting element with a negative electrode and a positive electrode formed on an upper surface thereof;

an insulating film formed in contact with a side surface of the light emitting element;

a wiring formed in contact with the insulating film for connecting between the negative electrode and the negative lead electrode, or between the positive electrode and the positive lead electrode.

This arrangement can prevent breaking the wiring to break in the light emitting device using the flexible substrate.

According to a second aspect of the present invention, a light emitting device includes:

a flexible substrate;

a negative lead electrode formed on an upper surface of the substrate, the negative lead electrode including a first coupling portion and a plurality of first extending electrodes, each having one end thereof coupled to the first coupling portion;

a positive lead electrode formed on an upper surface of the flexible substrate, the positive lead including a second coupling portion and a plurality of second extending electrodes, each having one end thereof coupled to the second coupling portion, the second extending electrode being positioned adjacent to the first extending electrode with a predetermined distance therebetween;

a plurality of light emitting elements, each having a positive electrode and a negative electrode on an upper surface thereof, the negative electrode being connected to one first extending electrode of the first and second extending electrodes, and the positive electrode being connected to the other second extending electrode;

an insulating film formed on a side surface of each of the light emitting elements; and a plurality of wirings each formed on the insulating film to connect between the positive electrode and the first extending electrode, or between the negative electrode and the second extending electrode.

According to a third aspect of the present invention, a light emitting device includes:

a substrate;

a negative lead electrode formed on an upper surface of the substrate, the negative lead electrode including a first coupling portion and a plurality of first extending electrodes, each having one end thereof coupled to the first coupling portion;

a positive lead electrode formed on an upper surface of the flexible substrate, the positive lead including a second coupling portion and a plurality of second extending electrodes, each having one end thereof coupled to the second coupling portion, the second extending electrode being positioned adjacent to the first extending electrode with a predetermined distance therebetween;

a plurality of light emitting elements each having a positive electrode and a negative electrode on an upper surface thereof, the light emitting element lying across between the first extending electrode and the second extending electrode;

an insulating film formed on a side surface of each of the light emitting elements; and a plurality of wirings each formed on the insulating film to connect between the negative electrode and the first extending electrode, or between the positive electrode and the second extending electrode.

Accordingly, the first to third aspects of the present invention provides the light emitting device having the higher reliability than a wire-bonding mounting type light emitting device while taking advantage of the face-up mounting type light emitting element that can be mounted on a versatile wiring board.

BRIEF DESCRIPTION OF THE DRAWINGS

FIGS. 2A and 2B are schematic diagrams for explaining the structure of the light emitting device according to a first embodiment of the present invention, in which FIG. 2A is a plan view of a light emitting element mounted on the light emitting device and FIG. 2B is cross-sectional view of a main part of the light emitting device, taken along the line A-A indicated by the arrows of FIG. 2A.

FIGS. 9A and 9B are schematic diagrams for explaining the structure of the light emitting device according to a sixth embodiment of the present invention, in which FIG. 9A is a plan view of a light emitting element mounted on the light emitting device and FIG. 9B is a cross-sectional view of a main part of the light emitting device, taken along the line B-B indicated by the arrows of FIG. 2A.

DETAILED DESCRIPTION OF THE EMBODIMENTS

Light emitting devices according to embodiments of the present invention will be described below with reference to the accompanying drawings. The terms "upper surface" and "lower surface" as used in the present specification mean surfaces in parallel to the x-y surface in each figure showing a wiring board 1 or light emitting element. In the following, a light emitting device according to a first embodiment of the present invention will be described with reference to FIGS. 1 and 2.

Figure 1:
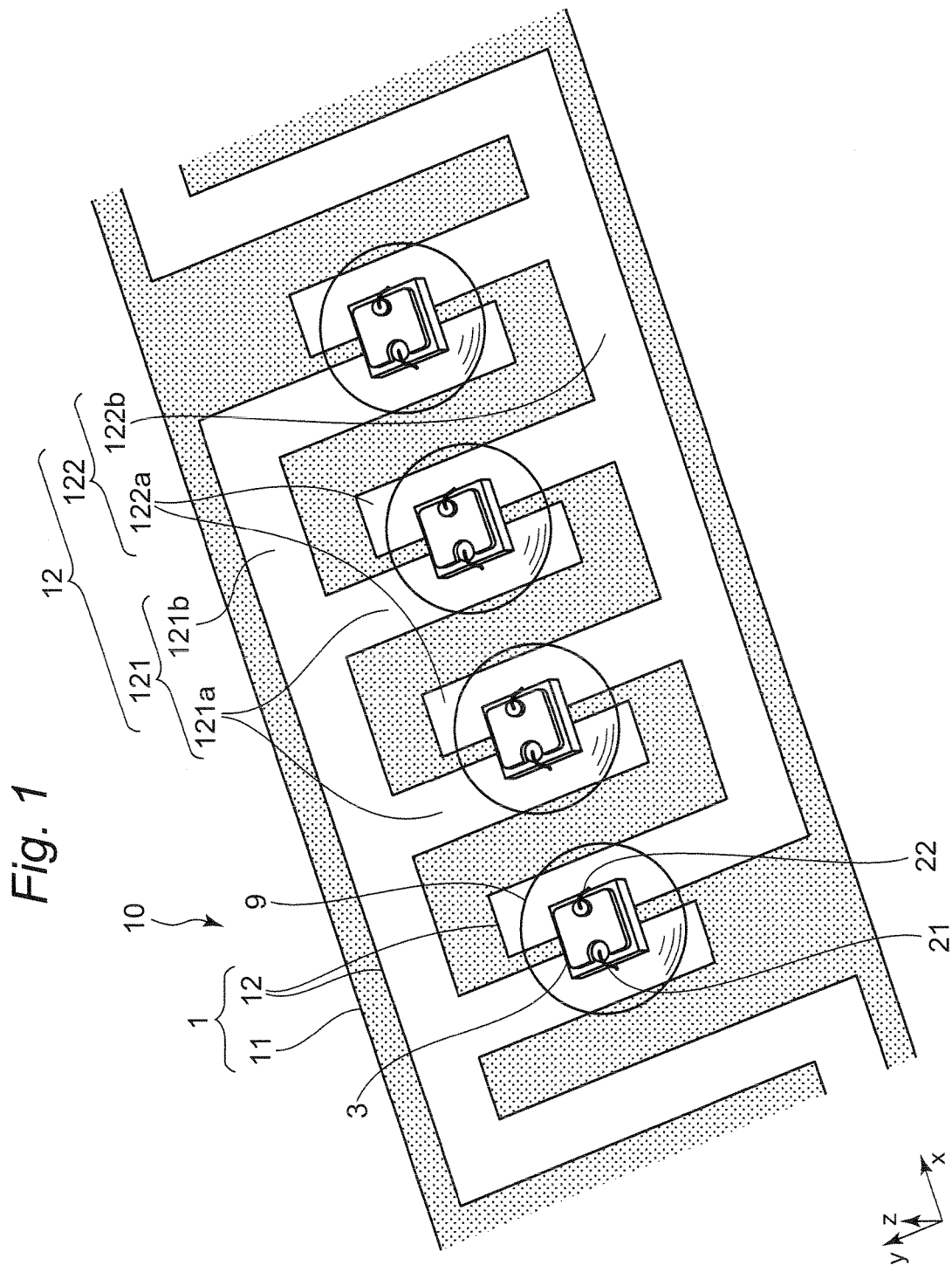
FIG. 1 is a schematic diagram for explaining the structure of a light emitting device according to an embodiment of the present invention.
Figures 2A, 2B:
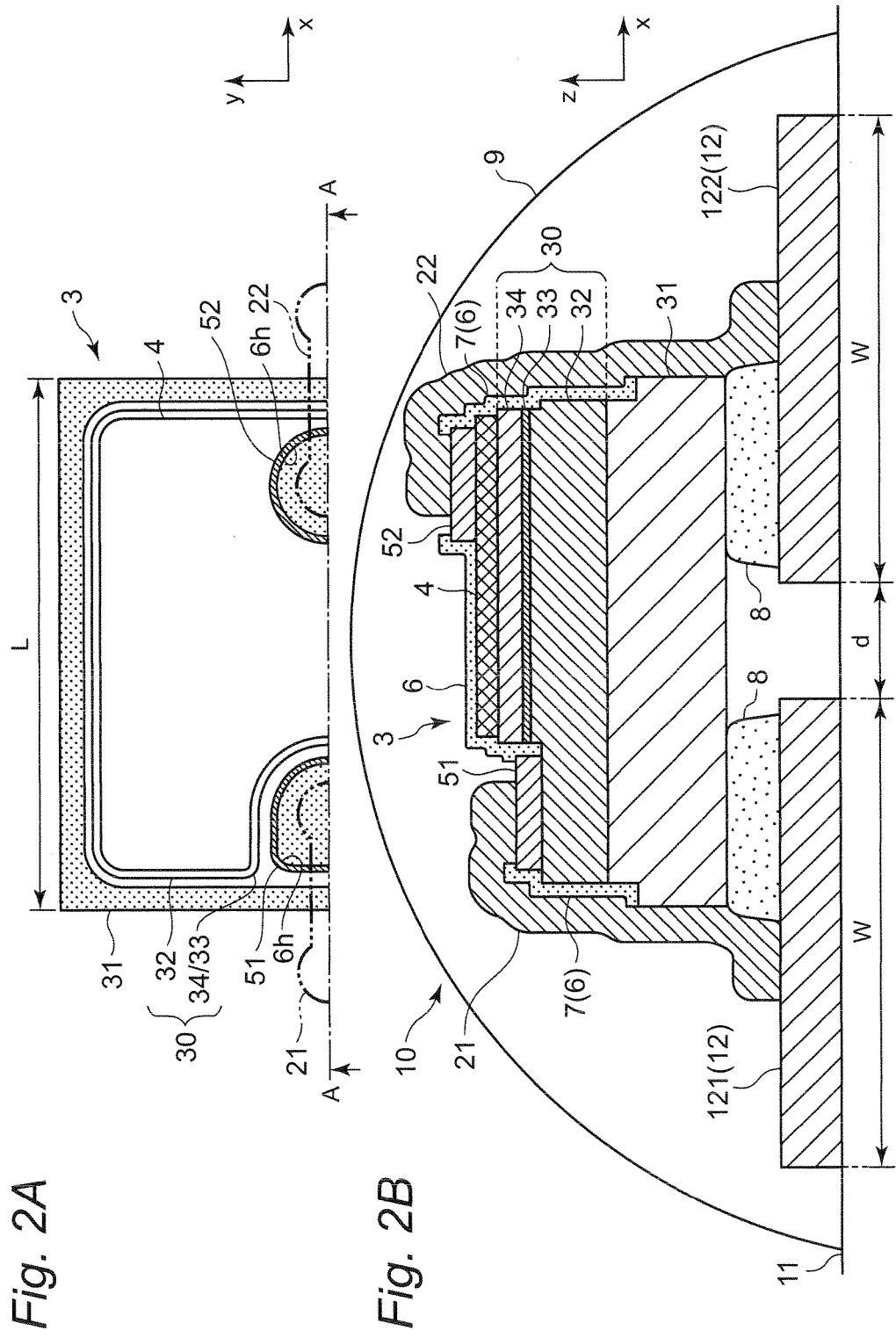

While FIG. 2A is an enlarged plan view of the part shown in FIG. 1 and FIG. 2B is a cross-sectional view of FIG. 2A, the dimensions of FIGS. 2A and 2B may not coincide with the dimension of FIG. 1 to show the details of the main part of the light emitting device that shown in FIG. 1.

First Embodiment

As shown in FIG. 1, a light emitting device 10 in a first embodiment of the present invention has its upper surface serving as a main light emitting surface, and includes four light emitting elements 3 mounted in a row on the tape-like wiring board (substrate) 1 in the longitudinal direction (in the direction x of the figure). Specifically, in the light emitting device 10, the light emitting elements 3 having a substantial square in plan view are mounted on the wiring board 1 while their surface (upper surface) provided with a pair of pad electrodes (electrodes) 51 and 52 are facing upward (see FIG. 2A). In the present specification, the term "on" refers to not only direct contact but also indirect contact. For example, the light emitting elements 3 may be mounted on the wiring board 1 with a bonding member intervened therebetween. The pad electrodes 51 and 52 are electrically connected to lead electrodes 12 on the wiring board 1 by the die wires (wirings) 21 and 22. In the present specifications below, the state of connection accompanied by electrical conduction simply represents "connection". As shown FIG. 2B the die wires 21 and 22 are formed in contact with the surface of insulating film 7 covering both side surfaces of the light emitting element 3. In the light emitting device 10 of this embodiment, light emitting elements 3 and the surface of the wiring board 1 surrounding each of the light emitting elements are respectively sealed by a seal members 9 having substantially dome shape. The light emitting device 10 in this embodiment is used as one device having the four light emitting elements 3 in the longitudinal direction as shown in FIG. 1, However, for simplification, in the present specification, one light emitting device including one light emitting element 3 and the seal member 9 sealing the one light emitting element will be regarded as one light emitting device 10 and thus will be described below.

(Wiring Board)

A flexible substrate, more particularly a flexible printed substrate (FPC: Flexible Printed Circuits) for mounting a wire-bonding mounting type light emitting element can be used as the wiring board 1. The wiring board 1 includes a sheet (film) like base 11 having flexibility, such as a polyimide film, and lead electrodes 12 formed of a metal film, such as a copper film, on the base. The base 11 may be formed of general flexible substrate materials, including a liquid crystal polymer (LCP), polyethylene terephthalate (PET), and the like, in addition to polyimide. Particularly, the base 11 is preferably formed using polyimide or LCP having a coefficient of thermal expansion relatively close to that of metal forming the lead electrode 12, such as copper, from the viewpoint of suppressing the peeling of the lead electrode 12 due to the thermal stress.

The shape and thickness of the base 11 are not specifically limited, and can be appropriately designed in accordance with the form or application of the light emitting device which is provided to users as a product. When the shape of the flexible substrate is a long shape in one direction (for example, rectangular shape having a short side and a long side), breakage of the wiring of the light emitting element is likely to occur.

However, use of the structure of the first embodiment of the present invention enables effective prevention of breakage of the wiring.

The lead electrodes 12 include a negative lead electrode 121 and a positive lead electrode 122. The negative lead electrode 121 and the positive lead electrode 122 (hereinafter collectively referred to as the "lead electrode 12") can be formed using metal materials for general wiring boards for semiconductor elements. Such the metal materials include copper, silver, gold, aluminum, and the like Particularly, copper is preferable in terms of thermal conductivity and workability. The lead electrode 12 can be formed by depositing a metal layer on the surface of the base 11 by the well-known method, such as plating or vapor deposition, and then patterning the deposited layer through etching or the like. When the base 11 is formed of LCP, a metal foil may be bonded by thermocompression of the LCP. The lead electrode 12 can also be formed by printing the conductive ink on the surface of the base 11. The thickness and width of the lead electrode 12 are not specifically limited, and can be appropriately designed in accordance with the resistance of the lead electrode, and the driving voltage and driving current of the light emitting element 3 mounted on the light emitting device 10 and so on.

The pattern shape (shape in the plan view) of each of the negative lead electrode 121 and the positive lead electrode 122 is not specifically limited. In this embodiment, both the lead electrodes 121 and 122 are arranged to cause the upper surfaces thereof to be bonded the bottom of the light emitting element 3. For example, as shown in FIG. 1, the light emitting device includes a plurality of light emitting elements 3 arranged and mounted along with in the longitudinal direction of the tape-like wiring board (substrate) 1 can have the following pattern shape. The negative lead electrode 121 has a comb-like shape including a first coupling portion 121b and a plurality of first extending electrodes 121a each having its end coupled to the first coupling portion 121b. The positive lead electrode 122 has a comb-like shape including a second coupling portion 122b and a plurality of second extending electrodes 122a each having its end coupled to the second coupling portion 122b. The negative lead electrode 121 and the positive lead electrode 122 are arranged on the upper surface of the wiring board 1 such that the first extending electrode 121a and the second extending electrode 122a are opposed to each other by a predetermined distance. In a region with the light emitting element 3 mounted on, a distance between the first extending electrode 121a and the second extending electrode 122a is set smaller than the length of one side of the light emitting element 3. In the way mentioned above, the negative lead electrode 121 and the positive lead electrode 122 are configured, thereby allowing the light emitting element to be mounted across from the negative lead electrode 121 (first extending electrode 121a) to the positive lead electrode 122 (second extending electrode 122a).

With this arrangement, the lower ends of respective regions in the side surfaces of the light emitting element 3 which is mounted on the wiring board 1 provided with at least die wires 21 and 22 are positioned on the first extending electrode 121a and the second extending electrode 122a. Thus, in respective positions in the vicinity of the lower ends of the side surfaces of the light emitting elements 3, the first extending electrode 121a can be connected to the die wire 21, and the second extending electrode 122a can be connected to the die wire 22. More specifically, as shown in FIG. 2, the negative lead electrode 121 and the positive lead electrode 122 are formed such that a distance (interval) d between the first extending electrode 121a and the second extending electrode 122a is shorter than the length L of the light emitting element 3 in the direction x, and that a distance (W+d+W) between an outer end of the first extending electrode 121a and an outer end of the second extending electrode 122a is longer than the length L of the light emitting element 3 in the direction x (d<L<W+d+W). With this arrangement, the die wire 21 (22) can be provided to extend from the surface of the pad electrode 51(52) of the light emitting element 3 to reach the surface of the first extending electrode 121a (second extending electrode 122a) directly under the light emitting element 3 via the side of the light emitting element 3 (surface of the insulating film 7). The die wires 21 and 22 can be directly connected to the surfaces of the first extending electrode 121a and the second extending electrode 122a without being formed on the surface of the base 11 formed of resin, which might reduce the possibility of breakage of the wiring due to the bending stress as compared to the case where a part of the die wire is formed on the surface of the base 11 formed of resin even in use of the flexible wiring substrate 1, the wiring is unlikely to be broken. The distance between the pad electrode 51(52) of the light emitting element 3 and the first extending electrode 121a (second extending electrode 122a)

can become short, which results in a short length of the die wire 21 (22). As mentioned above, in this embodiment, the light emitting element is mounted across between the negative lead electrode and the positive lead electrode, which can connect the negative electrode and the positive electrode to the negative lead electrode and the positive lead electrode by the short distances respectively. The wirings formed substantially only on the side surfaces of the substrate can connect the positive electrode and the negative electrode to the positive lead electrode and the negative lead electrode respectively, which does not need the formation of the wirings on the substrate.

Thus, the risk of breakage of the wiring can be reduced.

Preferably, in this embodiment, the first extending electrode 121a and the second extending electrode 122a are sufficiently overhung toward the outside of the light emitting element 3 in the direction x (W+d+W>>L). With this arrangement, the die wire 21 (22) can be formed to extend toward the outside of the light emitting element 3 on the first extending electrode 121a (second extending electrode 122a), which can increase a contact area between the die wire 21 and the first extending electrode 121a, and another contact area between the die wire 22 and the second extending electrode 122a, easily improving the reliability of the light emitting device 10. As shown in FIG. 1, he first extending electrode 121a and the second extending electrode 122a have the same width (length in the direction x) W in this embodiment, but may differ from each other. As shown in FIG. 2, in this embodiment, the light emitting device 10 is disposed such that the center of the light emitting element 3 coincides with the center between the first extending electrode 121a and the second extending electrode 122a (the center of the interval d) in the direction x, but the present invention is not limited thereto.

The lead electrode 12 formed of metal can serve as a reflective film to improve the light extraction efficiency of the light emitting device 10 in the case where the light emitted downward from the light emitting element 3 is applied to the lead electrode 12. The light emitting element 3 can be coupled not to the base 11 but to the lead electrode 12 to improve the heat dissipation property of the light emitting device 10. For the purpose of this, the lead electrode 12 preferably has such a pattern shape as to be bonded to the bottom of the light emitting element 3 in a larger area while the distance d between the first extending electrode 121a and the second extending electrode 122a is determined as they do not short-circuit therebetween.

The first extending electrode 121a and the second extending electrode 122a are preferably formed to have a large width. As shown in FIG. 1, the first extending electrode 121a and the second extending electrode 122a extend outward from below the light emitting element 3, thereby increasing a width W so as to cover the substantially whole region where the seal member 9 is formed, so that the electrodes serve as not only a low-resistance conductor, but also effectively serves as a reflective film and a heat sink. Like the light emitting device 10 of this embodiment, when the wiring board 1 has a tape-like shape in manufacturing (assembly), the first extending electrode 121a and the second extending electrode 122a are preferably arranged along with the longitudinal direction, that is the direction X. With this arrangement the die wires 21 and 22 can be shaped substantially in parallel to the longitudinal direction of the wiring board 1 in the plan view, which enhances the workability of formation of the die wires 21 and 22 by the ink jet method as will be mentioned below. However, the die wires 21 and 22 may be formed in substantially vertical or an inclined angle with respect to the longitudinal direction of the wiring board 1 in the plan view. With this arrangement, the die wires 21 and 22 can avoid bending stress experienced on wiring board 1 or light emitting device 3.

As mentioned above, the lead electrodes 12 serve as the reflective film, and may have metal films with a high reflectivity stacked on its surface by plating or the like. Such materials include one kind of metal selected from silver, rhodium, gold, and aluminum, or an alloy of the above metals. As to reflect visible light, silver is preferable because of its high reflectivity. The lead electrode 12 can have a double-layered structure formed by stacking a copper layer and a silver layer thereon, which can improve both the thermal conductivity (heat dissipation property) and the light extraction efficiency of the light emitting device 3. A metal film may be formed as a reflective film in a region on the surface of the base 11 without the lead electrode 12. In this case, the metal film serving as the reflective film is formed so as not to bring the negative lead electrode 121 and the positive lead electrode 122 into electrical conduction.

(Die Wire)

The die wire 21 is a wiring for connecting an n-side pad electrode 51 of the light emitting element 3 to the negative lead electrode 121. The die wire 22 is a wiring for connecting a p-side pad electrode 52 of the light emitting element 3 to the positive lead electrode 122. That is, the die wire 21 and the die wire 22 are provided in place of bonding wires in the wire bonding mounting. The die wires 21 and 22 are formed along the side surfaces of the light emitting element 3, specifically, directly on the surface of the insulating film 7 covering the side surfaces of the light emitting element 3. In contrast, in the wire bonding, any part of the bonding wires other than its both ends (connection parts) is supported only by a seal member (resin). The die wires 21 and 22 of this embodiment are supported by the light emitting element 3 (specifically, insulating film 7) and the seal member 9 by being sandwiched between them. Thus, unlike the bonding wires, the die wires 21 and 22 are so hard that they do not break.

The die wires 21 and 22 can be formed by printing (drawing) and attaching the conductive ink containing metal nanoparticles made of Au, Ag, Cu, and the like on the light emitting element 3 mounted on the wiring substrate 1 and the insulating film 7 covering its side surfaces of the light emitting element 3, and firing the attached ink, if necessary. As a method for forming (printing) the die wires 21 and 22, a general method for forming wiring for a wiring board or the like by printing can be applied, for example, an ink-jet method or a screen printing method. Particularly, the ink jet method can easily form the die wires 21 and 22 continuously at a surface with a stepped portion caused by the thickness of the light emitting element 3. The conductive ink corresponding to a printing method can be applied. The conductive ink has preferably a firing temperature of about 200° C. or lower to suppress the damage to the light emitting element 3 or other members.

The shape of the die wire 21 (22) is not specifically limited thereto. The die wire 21 (22) is preferably formed to connect the pad electrodes 51 (52) to the negative lead electrode 121 (positive lead electrode 122) in the shortest distance in order to shorten the length of the wiring. As shown in FIG. 2A, the die wire 21 (22) in this embodiment is formed to have the width of both ends thereof increased, and to increase a contact area with the pad electrode 51 (52), and negative lead electrode 121 (positive lead electrode 122). Like the light emitting device 10 of this embodiment, when the wiring board 1 has a tape-like shape, the die wires 21 and 22 are preferably shaped in substantially parallel to the longitudinal direction of the wiring board 1 in the plan view (in the direction x of the figure) to enhance the workability of the ink jet method as will be mentioned below. However, the die wires 21 and 22 may be formed in substantially vertical or an inclined angle with respect to the longitudinal direction of the wiring board 1 in the plan view. With this arrangement, the die wires 21 and 22 can avoid bending stress experienced on wiring board 1 or light emitting device 3. As described above, in this embodiment, the die wire 21 (22) is provided along the left (right) side surface of the light emitting element 3 so as to be directed vertically downward from the substantial center of one side closest to the pad electrode 51 (52) among four sides of the upper surface of the light emitting element 3. The thickness and width of the die wires 21 and 22 are not specifically limited, and can be appropriately designed in accordance with the resistance of the conductor, and the driving voltage and driving current of the light emitting element 3 mounted on the light emitting device 10. However, the thickness of the die wires 21 and 22 are preferably in a range of about 10 to 20 μm in order to decrease the wiring width, while decreasing the resistance of the wiring and not to interrupt a great amount of the light emitted from the light emitting element 3.

[Light Emitting Element]

The light emitting element 3 is a light source for the light emitting device 10, and is a semiconductor element (semiconductor light emitting element) that emits light by applying a voltage, for example, a light emitting diode (LED) comprised of a nitride semiconductor or the like. In this embodiment, The light emitting element 3 mounted on the light emitting device 10 can be one of the wire-bonding mounting type and not limited. Particularly, the light emitting element 3 which the side surfaces are processed in a manufacturing method to be mentioned below is preferred.

In this embodiment, the light emitting element 3 has a symmetrical structure in the direction y having a substantially square shape with each side of length L in the plan view. FIG. 2A which is the plan view shows a half part of the light emitting device with respect to the central line of the light emitting elements 3 (A-A line). The light emitting element 3 can be manufactured, for example, by stacking an n-type semiconductor layer 32, an active layer (light emitting layer) 33, and a nitride semiconductor layer 30 of a p-type semiconductor layer 34 on a translucent substrate (element substrate) 31 made of such as sapphire, in that order by epitaxial growth, and forming electrodes (n-side pad electrode 51, translucent electrode 4, and p-side pad electrode 52) connected to the n-type semiconductor layer 32 or the p-type semiconductor layer 34. In the light emitting device 10 of this embodiment, the light emitting element 3 is mounted on the wiring board 1 with the element substrate 31 facing down, and is provided with the pad electrodes 51 and 52 which receive the supply of current from the outside near the centers of the left and right sides of the upper surface of the light emitting element. That is, the light emitting element 3 is a face-up mounting (wire-bonding mounting) type semiconductor element including the pair of pad electrodes 51 and 52 on its upper surface. The components of the light emitting element 3 will be described in detail below.

(Element Substrate)

Materials for the element substrate 31 are not specifically limited but can be a substrate material that can grow and/or laminated layers of the nitride semiconductor 30 thereon during the manufacturing of the light emitting element 3, for example. The substrates made of such a material include an insulating substrate such as a sapphire substrate having any one of a C surface, an R surface, and an A surface as a main surface and a spinel ($MaAl_2O_4$) substrate having a (111) surface as a main surface, silicon carbide (SiC), ZnS, ZnO, Si, GaAs, diamond, and an oxide substrate containing an oxide, such as lithium niobate and neodymium gallium oxide, which are lattice-matched to a nitride semiconductor. In the light emitting device 10 of this embodiment, the bottom of the light emitting element 3 (the backside of the element substrate 31) is bonded to both a pair of negative and positive lead electrodes 121 and 122 of the wiring board 1. Further, the die wires 21 and 22 are provided directly on the side surfaces (end surfaces) of the element substrate 31. Thus, an insulating substrate, for example, a sapphire substrate is used as the element substrate 31.

The size, thickness, and the like of the element substrate 31 are not specifically limited. In the manufacturing process of the light emitting element 3, a number of light emitting elements 3 which are arranged in a matrix can be formed on one piece of the element substrate 31 (wafer). Thus, it is preferable for the substrate to obtain some strength as the base, and to have enough thickness to keep its strength. On the other hand, the element substrate 31 is preferably thinned by grinding (backgrinding) from its back surface so as to be divided into chips by cutting (dicing) or tearing (breaking) after completing the light emitting element 3 (wafer). In particular, in the light emitting device 10 of this embodiment, the thickness of the light emitting element 3 is preferably small (thin) so that the die wires 21 and 22 are easily formed and may be short. Thus, the element substrate 31 is preferably thinned to such a degree that does not affect the nitride semiconductor 30 (as long as the substrate keeps the necessary strength), and can have a thickness of, for example, 50 to 250 μm by the grinding or the like.

(Nitride Semiconductor)

The n-type semiconductor layer 32, the active layer 33, and the p-type semiconductor layer 34 are not specifically limited, but may be suitably formed of a gallium nitride compound semiconductor, such as $In_XAl_YGa_{1-X-Y}N$ ($0 \leq X$, $0 \leq Y$, $X+Y<1$). The n-type semiconductor layer 32, the active layer 33, and the p-type semiconductor layer 34 (hereinafter collectively referred to as the "nitride semiconductor 30") may have a single layer structure, but may have a laminated structure of layers with different compositions and thicknesses or superlattice structure. Particularly, the active layer 33 serving as a light emitting layer preferably has a single quantum well structure or a multiple quantum well structure formed of laminated thin films having a quantum effect. More preferably, the active layer 33 is formed of a nitride semiconductor in which a well layer contains In. The n-type semiconductor layer 32 may be formed on the element substrate 31 via an underlayer, such as a buffer layer, for relaxing the misalignment with the lattice constant of between the element substrate 31.

(Electrodes)

The light emitting element 3 can include the n-side pad electrode 51 connected to the n-type semiconductor layer 32, and the p-side pad electrode 52 connected to the p-type semiconductor layer 34. In order to supply the electric current from the outside to the light emitting element, the n-type side pad electrode 51 and the p-type pad electrode 52 are respectively connected to the wiring board 1 (negative lead electrode 121, and positive lead electrode 122) by the die wires 21 and 22, respectively. The light emitting element 3 of the light emitting device 10 of this embodiment is provided with an n-side electrode and a p-side electrode on the side of the p-type semiconductor layer 34 so as to form both electrodes on the same surface side, in which the p-type semiconductor layer 34 side is located on the light extraction side. Specifically, as shown in FIG. 2A, the p-type pad electrode 52 is provide on a translucent electrode 4 formed substantially on the whole upper surface of the p-type semiconductor layer 34 so as to allow the current to flow uniformly through the entire surface of the p-type semiconductor layer 34 having a relatively high resistance. On the other hand, the n-type pad electrode 51 is provided on the n-type semiconductor layer 32 exposed by removing parts of the p-type semiconductor layer 34 and active layer 33, and connected to the n-type semiconductor layer 32.

The translucent electrode 4 can be made of translucent conductive material, specifically, a conductive oxide, such as indium tin oxide (ITO) or a zinc oxide (ZnO). The pad electrodes 51 and 52 can be formed of metal materials, such as Al, Cu, and Au. The pad electrodes 51 and 52 can be formed to have the shape and area required for connection with the n-type semiconductor layer 32 or translucent electrode 4, and the shape and area in the plan view required for connection with the die wires 21 and 22. The pad electrodes 51 and 52 are preferably provided at the peripheral edge or in the vicinity of sides of the light emitting element 3 in the plan view. With this arrangement, the die wires 21 and 22 may be short in mounting the light emitting element 3 on the wiring board 1. Particularly, when the die wires 21 and 22 are formed by the ink jet method, the excessive conductive ink can be suppressed from being attached to the upper surface of the light emitting element 3.

(Protective Film, Insulating Film)

A protective film 6 can be covers the exposed surface (upper surface and end surfaces in this embodiment) of the nitride semiconductor 30 and/or the surface of the translucent electrode 4 on the light emitting element 3. Specifically, the protective film 6 is preferably formed except for pad openings 6h serving as regions for connection with the outside. In this embodiment, the protective film 6 covers the peripheral edges of the upper surfaces of the pad electrodes 51 and 52. The regions of the upper surface of each of the pad electrodes 51 ad 52 except for the peripheral edges thereof serves as the pad openings 6h. Further, in the light emitting device 10 of this embodiment, the protective film 6 is integrally formed with an insulator (hereinafter referred to as the insulating film 7 for convenience) for insulating the die wires 21 and 22 from the nitride semiconductor 30, in contact with the side surfaces (end surfaces) of the light emitting element 3. The insulating film 7 covers the regions of the side surfaces of the light emitting element 3 provided with at least the die wires 21 and 22 not to expose each of the layers 32, 33, and 34 of the nitride semiconductor 30. Particularly, when the die wires 21 and 22 are formed by the ink-jet method, in order to prevent the short-circuit due to the attachment of the excessive conductive ink, the protective film 6 (insulating film 7) is preferably coated not to expose the nitride semiconductor 30 and the translucent electrode 4 of the light emitting element 3. In the light emitting device 10 of this embodiment, the protective film 6 (insulating film 7) covers entire surface of the light emitting element 3 except for the pad openings 6h on its upper surface, the bottom surface, and lower part of the side surfaces (element substrate 31) of the light emitting element 3.

The insulating film 7 is preferably formed of a translucent inorganic insulating material. The insulating film 7 is preferably formed on at least each side surface of the light emitting element 3 in an approximately uniform thickness. This is because the inorganic film would have better durability, and thus decrease in translucency might be less likely to occur, and the die wires 21 and 22 formed on the surface of the inorganic film might be less likely to be broken, as compared to a translucent resin film, such as an epoxy resin. The protective film 6 may be formed of any translucent insulating material, which is not limited to the inorganic material. Like the insulating film 7, preferably, the protective film 6 is formed by the inorganic material that can be deposited in manufacturing the light emitting element 3 (wafer). Suitable inorganic insulating materials for the protective film include an oxide of Si, Ti, Ta, Nb, Zr, Mg, or the like ($SiO_2$, $TiO_2$, $Ta_2O_5$, $Nb_2O_5$, $ZrO_2$, MgO), or a nitride, such as a Si nitride (for example, $Si_3N_4$) or AlN, or magnesium fluoride ($MgF_2$). The thickness of each of the protective film 6 and the insulating film 7 is not specifically limited, but preferably in a range of 10 to 10000 nm. These materials can be deposited by the well-known methods, such as the vapor deposition or sputtering, in manufacturing the light emitting element 3. Specifically, while a number of the light emitting elements 3 are formed at one piece element substrate 31 (wafer) in a matrix, the protective film 6 (insulating film 7) can be deposited. In order not to expose any part of the nitride semiconductor 30, on a cut surface formed when singulating (dicing) the wafer into the finished light emitting elements 3, the nitride semiconductor 30 in the peripheral edges of the light emitting element 3 (chip), which is a scribe region, represented by hatching in FIG. 2A, can be previously removed completely, and the insulating film 7 can be formed thereon. The details of the above is being described in paragraphs about the manufacturing method.

Other components of the light emitting device 10 in the first embodiment will be described in detail below.

(Bonding Member)

A bonding member 8 is to fix the light emitting element 3 to the wiring board 1.

In the light emitting device 10 of this embodiment, the bottom surface (backside of the element substrate 31) of the light emitting element 3 is bonded to the surface of the lead electrode 12 formed on the wiring board 1. The bonding member 8 is preferably provided not to excessively increase the distance between the light emitting element 3 and the wiring board 1 (specifically, first expanding electrode 121a and second expanding electrode 122a), whereby the first extending electrode 121a (second extending electrode 122a) can get close to the pad electrode 51(52), which can easily and surely connect the first extending electrode 121a (second extending electrode 122a) to the die wire 21 (22). That is, the bonding member 8 is preferably formed thinly such that a distance between the light emitting element 3 and the wiring board 1 (first extending electrode 121a and second extending electrode 122a) becomes smaller in the regions where at least the die wires 21 and 22 are formed.

In the light emitting device 10 of this embodiment, the bonding member 8 can be one of the insulating and conductive bonding members that can be used to mount (die-bond) the general semiconductor element because the bonding member 8 does not need to electrically connect the light emitting element 3 to the wiring board 1, and the bonding surface (bottom surface) of the light emitting element 3 is the insulating element substrate 31. The insulating bonding member can be formed of adhesives, such as epoxy or silicon based adhesive. The conductive bonding member can be formed of a solder, a conductive paste, such as Ag, or eutectic alloy. The conductive bonding member is preferably used. In general, the conductive member, such as solder, has a higher thermal conductivity than that of a resin adhesive, which can improve the heat dissipation property of the light emitting device 10. As shown in FIG. 2B, the conductive bonding members 8 can be separately provided on the negative lead electrode 121 and the positive lead electrode 122, respectively, not to establish a short-circuit between the negative and positive lead electrodes 121 and 122 and each bonding member 8 can be bonded to the bottom surface of the light emitting element 3. On the other hand, the insulating bonding member 8 may be provided on the whole bottom surface of the light emitting element 3, that is, on the base 11 between the negative and positive lead electrodes 121 and 122.

(Seal Member)

The seal member 9 is a member for protecting other members such as the light emitting element 3, a part of the negative lead electrode 121, a part of the positive lead electrode 122, and the die wires 21, 22 and the like from refuse, moisture, external force, and the like by sealing (embedding) the above members therewith. As shown in FIG. 1, for example, the seal member 9 can be formed by discharging a translucent resin material on the region of the wiring board 1 which the light emitting element 3 mounted thereon by use of a dispenser and the like and hardening the resin material. The shape of the seal member 9 is not limited as long as the seal member 9 can embed at least the light emitting element 3 and the die wires 21 and 22. In the first embodiment of the present invention, the die wires 21 and 22 are disposed excessively close to the light emitting element 3 without protruding from the upper and side surfaces thereof, unlike the bonding wire. Thus, the seal member 9 does not need to be formed thickly on the light emitting element 3. The thickness or shape of the seal member 9 can be determined depending on required characteristics such as optical effects and others. For example, in the light emitting device 10 of this embodiment, the seal member 9 is formed substantially in a dome shape to have a circle shape in a plan view by raising a resin material whose viscosity is adjusted to a relatively high, within a circle enclosing the light emitting element 3 on the wiring board 1 (see FIG. 1). Thus, the seal member 9 can effectively apply the light from the light emitting element 3 to the outside of the seal member.

Like the light emitting device with the general light emitting element, the seal member 9 can be formed of the translucent resin material for allowing the light from the light emitting element 3 to pass therethrough. Specifically, suitable materials for the seal member 9 preferably include silicon-based resin includes hybrid silicon, epoxy-based resin, urea-based resin, and the like, and more preferably the silicon resin having excellent heat resistance and light resistance. To the resin material, a fluorescent material, a colorant, a light diffusing agent, a filler, and the like may be added according to the purpose or application of the light emitting device 10. Particularly, the silicon resin has a high coefficient of thermal expansion, and the filler is preferably used to appropriately reduce the coefficient of thermal expansion. Alternatively, the seal member 9 may have the structure that is so soft that it applies less stress to the light emitting element 3 and die wires 21 and 22 while being hard enough to protect them.

[Method for Manufacturing Light Emitting Device]

A method for manufacturing the light emitting device, including manufacture of the light emitting element to be mounted, according to the first embodiment of the present invention will be described below with reference to FIG. 3.

Figure 3:
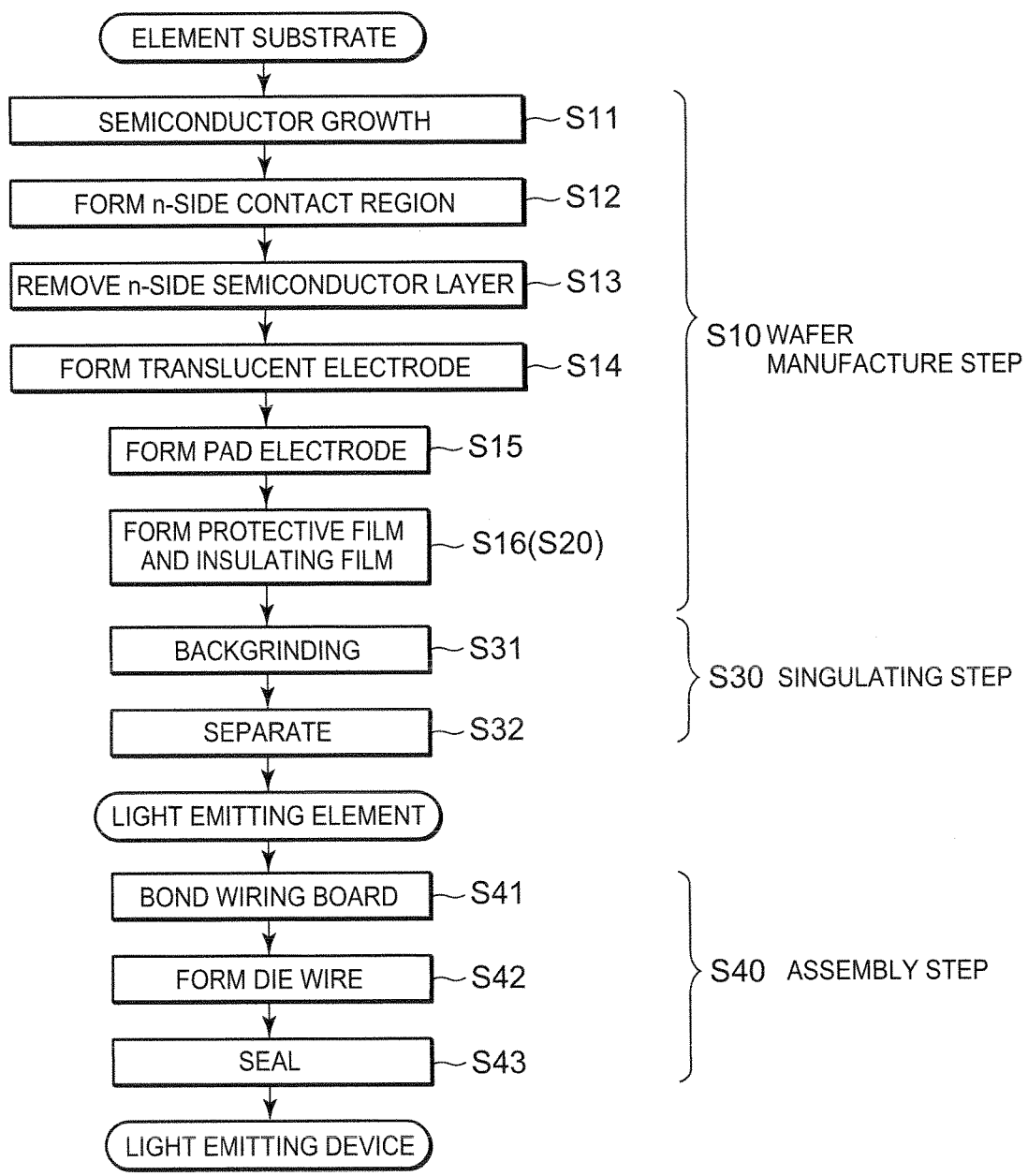
FIG. 3 is a flowchart for explaining a manufacturing method of the light emitting element according to the first embodiment of the present invention.

As shown in FIG. 3, the light emitting device 10 can be manufactured through at least a wafer manufacture step S10 for manufacturing a wafer with the light emitting elements 3 coupled together and arranged on the element substrate 31, a singulating step S30 for dividing the wafer by every light emitting element into the light emitting elements 3 (chips), and an assembly step S40 for mounting the light emitting element 3 on the wiring board 1. In this embodiment, the wafer manufacture step S10 includes an insulating film formation step S20 for forming the insulating film 7 to cover the side surface of the light emitting element 3. In this embodiment, the assembly step S40 includes a wiring board bonding step (light emitting element bonding step) S41 for placing and bonding the light emitting element 3 on the wiring board 1, a die wire formation step (wiring formation step) S42, and a sealing step S43 for sealing the light emitting element 3 with the seal member 9. In the following, each step will be described.

(Manufacture of Light Emitting Element: Formation of Nitride Semiconductor)

In the semiconductor growth step S11, the n-type semiconductor layer 32, the active layer 33, and the p-type semiconductor layer 34 which are made of the nitride semiconductor can be stacked and grown in that order on the element substrate 31 using a sapphire substrate as the element substrate 31 by a MOVPE reactor (in step S11).

In the method for manufacturing the light emitting device according to the first embodiment of the present invention, formation methods of the nitride semiconductor 30 of the light emitting element 3 mounted on the light emitting device 10 are not specifically limited, and can be the well-known method as the growth method of the nitride semiconductor, including metalorganic vapor phase epitaxy (MOVPE), metal organic chemical vapor deposition (MOCVD), hydride vapor phase epitaxy (HVPE), molecular beam epitaxy (MBE), and the like. Particularly, the MOCVD is preferable from the viewpoint of appropriately growing the layer with good crystallinity. The respective layers 32, 33, and 34 of the nitride semiconductor 30 are preferably grown by selecting from various growth methods for the nitride semiconductor in accordance with the intended function of each layer.

(Manufacture of Light Emitting Element: Formation of n-side Contact Region)

In order to form a region for connecting the n-side pad electrode 51 (n-side contact region), parts of the p-type semiconductor layer 34 and the active layer 33 are removed to expose the n-type semiconductor layer 32 at a part of the surface (front surface). Simultaneously, the peripheral edges (scribe region of the wafer) of the light emitting element 3 (chip) can be also etched to the same depth as that of the contact region for the n-side electrode (in step S12). Specifically, a mask with openings can be formed on the element substrate 31 (hereinafter referred to as a "wafer") with the respective layers of the nitride semiconductor 30 grown thereon using photoresist. The shapes of the openings correspond to the shape of the n-type contact region and the scribe region. After that, the p-type semiconductor layer 34, the active layer 33, and a part of the n-type semiconductor layer 32 can be removed by reactive-ion etching (RIE) to thereby expose the n-side contact layer at the n-type semiconductor layer 32 on its front surface.

(Manufacture of Light Emitting Element; Exposure of Chip Side Surface)

In order to expose the side surfaces of the light emitting element 3 (chip), the scribe region of the wafer can be further etched to completely remove the nitride semiconductor 30 (n-type semiconductor layer 32) from the scribe region (step S13). Specifically, a mask with an opening in the scribe region can be formed on the wafer. At this time, the shape of the opening of the mask is preferably designed to be narrower than that of the opening of the mask upon etching to the front surface of the n-type semiconductor layer 32, and wider than a cutting margin by dicing after the completion of the wafer. In the RIE, the n-type semiconductor layer 32 can be completely removed, and a part of the element substrate 31 thereunder can be removed. After the etching, the resist is removed. In this way, the scribe region can be etched in two steps to thereby form the side surfaces of the light emitting element 3 (chip) in a stepwise shape.

(Manufacture of Light Emitting Element: Formation of Electrode)

The translucent electrode 4 can be formed on the p-type semiconductor layer 34 (in step S14), and then the pad electrodes 51 and 52 can be formed to be respectively connected to the n-type semiconductor layer 32 and the p-type semiconductor layer 34 (in step S15). Specifically, first, a conductive oxide film for forming the translucent electrode 4 can be deposited on the entire surface of the wafer by sputtering. Then, a mask can be formed on the conductive oxide film to have the shape corresponding to the shape in the plan view (see FIG. 2A) of the p-type semiconductor layer 34 under the oxide film. Parts of the conductive oxide film not provided with the mask are etched and removed to form the translucent electrode 4 on the p-type semiconductor layer 34. After that the resist (mask) is removed. Then, other masks can be formed to have openings in a region for forming the p-side pad electrode 52 on the upper surface of the translucent semiconductor layer 4, and in a region for forming an n-side pad electrode 51 on the upper surface of the exposed n-type semiconductor layer 32. A metal electrode material can be deposited on the mask and openings by sputtering, the resist (mask) is removed (liftoff). In the above way, the n-side pad electrode 51 and the p-side pad electrode 52 can be formed.

(Manufacture of Light Emitting Element: Formation of Protective Film and Insulating Film)

The protective film 6 can be formed (in step S16), and at the same time, the insulating film 7 can be formed (in step S20). Specifically, an inorganic film such as $SiO_2$ or the like can be deposited on the entire surface of the wafer by sputtering or CVD method (chemical vapor deposition). Then, a mask can be formed on the inorganic film to have openings positioned above the pad openings 6h of the pad electrodes 51 and 52. Parts of the inorganic film exposed from the openings are etched, and then the resist is removed. Thus, the protective film 6 (insulating film 7 in the scribe region) can be formed on the entire surface of the wafer except for the pad openings 6h, which leads to the completion of the wafer.

(Singulating of Light Emitting Element)

The element substrate 31 can be ground (subjected to backgrinding) from the backside of the completed wafer into a desired small thickness (in step S31). The thus-obtained wafer with its backside ground can be divided by dicing or the like along the center line of the scribe region (in step S32) into individual light emitting elements 3 (chips). Each of the thus-obtained light emitting element 3 can be its side surface formed in the stepwise shape, and the side surfaces of the nitride semiconductor 30 and the upper part of the element substrate 31 thereunder can be covered with the insulating film 7.

(Assembly of Light Emitting Device)

An Ag paste can be applied to predetermined regions of the negative and positive lead electrodes 121 and 122 of the wiring board 1 where the light emitting elements 3 (chips) are mounted. The light emitting element 3 can be pushed against the paste, and heated to harden the Ag paste, causing the light emitting element 3 to be fixed to the wiring board 1 (in step S41). The Ag paste heated and hardened is converted into the bonding member 8.

Then, the conductive ink can be discharged by the ink jet method along the planar shape of each of the die wires 21 and 22 indicated by a two-dot chain line in FIG. 2A (along the regions where the die wires 21 and 22 are to be formed), and then fired to form the die wires 21 and 22 (in step S42). In this embodiment, the die wires 21 and 22 are shaped as substantially parallel lines in the plan view along the longitudinal direction (see FIG. 1, in the direction x) of the wiring board 1, and aligned with respect to the center in the width direction, so that the conductive ink can be discharged while the tape-like wiring board 1 is being moved in the longitudinal direction with the ink jet head fixed. Thus, the die wires can be easily formed with good workability. However, the die wires 21 and 22 may be formed in substantially vertical or an inclined angle with respect to the longitudinal direction of the wiring board 1 in the plan view. With this arrangement, the die wires 21 and 22 can avoid bending stress experienced on wiring board 1 or light emitting device 3. In this embodiment, the light emitting element 3 has its side surfaces formed in a stepwise manner, so that the conductive ink can be attached in a sufficient thickness on each side surface of the light emitting element 3 (surface of the insulating film 7) even though the conductive ink is discharged vertically downward.

The conductive ink may be discharged obliquely downward onto the side surfaces of the light emitting element 3 by inclining an ink jet head. Thus, even though the thickness (chip thickness) of the light emitting element 3 is large, or the light emitting element 3 has not a stepped portion on its side surfaces, but a flat vertical side surface, the conductive ink can be sufficiently attached to the side surfaces with ease.

A translucent resin material having substantially dome shape can be applied to the light emitting element 3 and its surroundings (see FIG. 1) on the wiring board 1 to completely cover the light emitting element 3 and the die wires 21 and 22. The applied translucent resin material can be hardened to form the seal member 9 (in step S43). Thus, as shown in FIG. 1, the four light emitting element 3 each sealed by the seal member 9 are supported by the tape-like wiring board 1 in one line, which produces the light emitting device 10.

Figure 7:
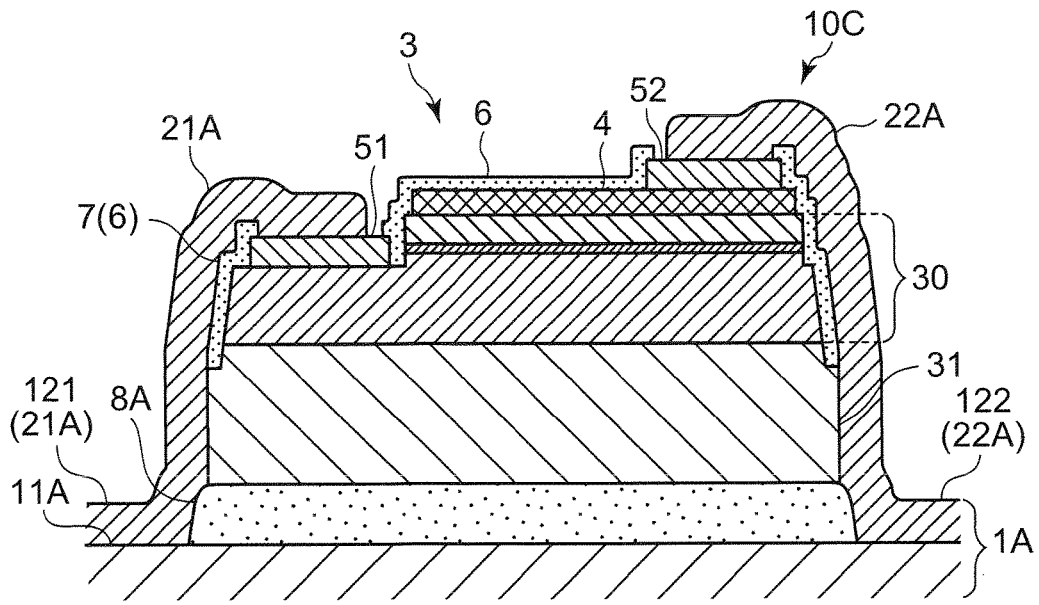
FIG. 7 is a schematic diagram for explaining the structure of a light emitting device according to a fourth embodiment of the present invention, specifically, a cross-sectional view of a main part of the light emitting device corresponding to the cross-sectional view taken along the line A-A indicated by the arrows of FIG. 2A.

The light emitting element 3 mounted on the light emitting device 10 in the first embodiment may have tapered side surface by etching in a 2nd etching (removal of the n-type semiconductor layer 32, in step S13), or in a 1st etching (exposure of the n-type semiconductor layer 32, in step S12) at a scribe region of the wafer, whereby the side surface of the light emitting element 3 may become an inclined surface expanding downward (see a fourth embodiment shown in FIG. 7). In the singulating step S30 (S32), the light emitting element 3 may be divided by using the cleavage property of the element substrate 31, whereby the cut surface of the element substrate 31 may be formed of an inclined surface expanding downward. By forming the side surfaces in such shapes, the conductive ink can be easily attached in a sufficient thickness on each side surface of the light emitting element 3 even though the conductive ink is discharged in the vertical downward direction in forming the die wires 21 and 22.

The light emitting device 10 in the first embodiment may have on the bottom surface (backside) of the light emitting element 3, a multi-layer film formed by alternately stacking two kinds of dielectric films with different refractive indexes. With this arrangement, the light emitting device 10 allows the light emitted downward from a light emitting layer (active layer 33) of the light emitting element 3 to be multiply-reflected, thereby improving the light extraction efficiency. The multi-layer film can be formed on the element substrate 31 of the light emitting element 3 obtained, for example, after grinding its backside (step S31) (see a third embodiment to be mentioned below).

As mentioned above, the light emitting device of the first embodiment can use the light emitting element and wiring board of the known wire-bonding mounting type to establish the connection without using the bonding wire. Particularly, even in the case where using the flexible wiring board, the wiring can be unlikely to be broken, which can improve the reliability of the light emitting device. The light emitting device can be provided with the wirings on the side surfaces of the light emitting element only via a thin film (insulating film), unlike a conventional light emitting device including an arc-shaped bonding wire. Even the light emitting device with the wirings can have substantially the same size as that of the light emitting element, and thus can easily reduce its size and thickness.

Second Embodiment

In the light emitting device according to the first embodiment of the present invention, the insulating film is formed to integrally cover the side surfaces of the light emitting element as the protective film for the light emitting element. However, the light emitting device of the present invention can also improve its light extraction efficiency by using the insulating film with an optical effect. In the following, a light emitting device according to a second embodiment of the present invention will be described with reference to FIG. 4. The same elements as those of the light emitting device of the first embodiment are designated by the same reference characters, and thus the description thereof will be omitted below.

Figure 4:
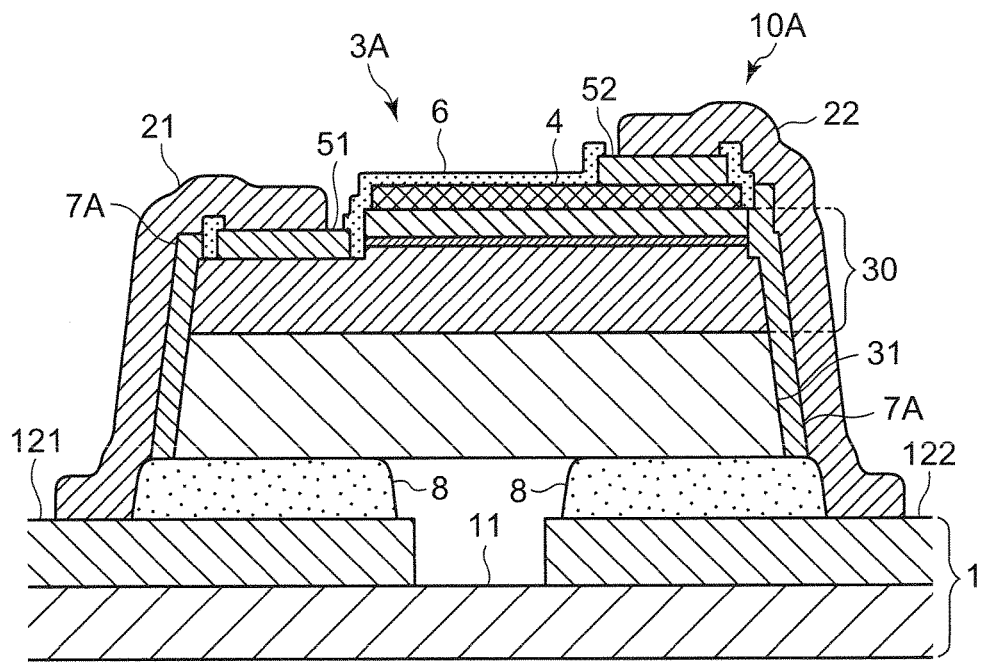
FIG. 4 is a schematic diagram for explaining the structure of a light emitting device according to a second embodiment of the present invention, specifically, a cross-sectional view of a main part of the light emitting device corresponding to the cross-sectional view taken along the line A-A indicated by the arrows of FIG. 2A.

A light emitting device 10A in the second embodiment of the present invention have the substantially same structure as that of the light emitting device 10 in the first embodiment except that a light emitting element 3A is mounted as a light source. As shown in FIG. 4, in the light emitting device 10A, the light emitting element 3A is mounted on the wiring board 1, the pad electrodes 51 and 52 located on its upper surface in pair are respectively connected to the negative and positive lead electrodes 121 and 122 of the wiring board 1 via the die wires 21 and 22, and the light emitting element 3A and its surroundings sealed with the seal member 9. The light emitting element 3A has substantially the same structure as that of the light emitting element 3 in the first embodiment except for the shape of the side surface of the light emitting element and the structure of a protective film 6 and an insulating film 7A covering the surfaces (upper surface and side surfaces) of the light emitting element. That is, the entire structure of the light emitting device 10A is substantially the same as that shown in FIG. 1, and thus the upper surface of the light emitting element 3A is substantially the same as that shown in FIG. 2A.

(Light Emitting Element)

In the light emitting element 3A, the semiconductor structure (element substrate 31, nitride semiconductor 30), and the electrode structure (translucent electrode 4, pad electrodes 51 and 52) have the same structure as that of the light emitting element 3, and thus the description thereof will be omitted below. The light emitting element 3A in the light emitting device 10A of this embodiment is the same as that of the first embodiment in that an insulating inorganic film is coated on an upper surface and side surfaces of the light emitting element 3A except for the pad openings 6h (see FIG. 2A). However, the light emitting element 3A of this embodiment differs from that of the first embodiment in that the protective film 6 covers only the upper surface of the light emitting element and that an insulating film 7A having a multi-layer structure is additionally provided to cover the side surfaces thereof. As shown in FIG. 4, the light emitting element 3A is formed to be inclined such that its four side surfaces (two side surfaces shown in the figure) expand downward. By forming the side surfaces in such a shape, the conductive ink can be easily attached in a sufficient thickness on each side surface of the light emitting element 3A (surface of the insulating film 7A) even though the conductive ink is discharged in the vertical downward direction in forming the die wires 21 and 22.

(Insulating Film)

In this embodiment, the insulating film 7A is formed of an inorganic material, like the insulating film 7 of the first embodiment, and includes two kinds of dielectric films with different refractive indexes alternately stacked. The die wires 21 and 22 are formed on the insulating film 7A having such multi-layer structure, so that the light emitted toward the side of the light emitting element 3A to be reflected by the die wire 21 or 22 progresses reversely within the insulating film 7A to be reflected at an interface of the multi-layer film, and then multiple-reflected within the insulating film 7A to change its path. Finally, most of the light can be applied to the outside of the light emitting device 10A while avoiding the die wires 21 and 22.

In the light emitting device 10A, the light emitting element 3A may have only its two side surfaces provided with the die wires 21 and 22 and covered by the insulating film 7A, and the other two side surfaces covered by the protective film 6 (single layer film) like its upper surface. In this case, latter two side surfaces may be formed vertically. In the light emitting device 10A, however, in order to equalize the light emitting intensity within an emitting surface (seal resin surface), four side surfaces of the light emitting element 3A are preferably formed as an inclined surface, and covered by the insulating film 7A. The insulating film 7A preferably covers larger area of the side surfaces of the light emitting element 3A in order to enhance the optical effects. In an example shown in FIG. 4, an area of the light emitting element up to its lower end, that is, the entire side surfaces thereof are covered by the insulating film. 7A. The entire side surfaces and upper surface of the light emitting element 3A except for the pad openings 6h are covered by the inorganic films, including the insulating film 7A and the protective film 6, which can prevent the resin (seal member 9) of the light emitting device 10A from contacting the nitride semiconductor 30 and the element substrate 31. Thus, the resin (seal member 9) can be suppressed from being degraded due to heat or light, improving the durability of the light emitting device. The structure of the insulating film 7 of the present invention is not limited to the above. Like the insulating film 7 of the light emitting device 10 in the first embodiment, the lower part of the element substrate 31 may be exposed.

Each of the dielectric films included in the insulating film 7A as the multi-layer film is formed using the well-known insulating material for the protective film of the semiconductor element, like the insulating film 7 (protective film 6) of the first embodiment. Low-refractive index materials for the insulating film 7A include, for example, $SiO_2$, $MgF_2$, and high-refractive index materials for the insulating film 7A include, for example, $TiO_2$, $Ta_2O_5$, $Nb_2O_5$, $ZrO_2$, $Si_3N_4$, depending on the wavelength range of light emitted from the light emitting element 3A. The number of the insulating films 7A is not specified. The insulating film includes one or more pairs of the low-refractive index material/high-refractive index material. Preferably, the low-refractive index material/high-refractive index material can be stacked in that order from the side of (from below) the light emitting element 3A because light is unlikely to enter the low-refractive index material from the high-refractive index material and easily reflected at an interface therebetween. In the insulating film 7A, at least one layer of the low-refractive index material layer and the high-refractive index material layer may be formed by stacking two or more kinds of materials with similar refractive indexes, or may be formed of a multi-layer film of layers with three or more different refractive indexes. Each (single layer) of the dielectric films included in the insulating film 7A preferably has a thickness of 10 nm or more because each dielectric film suitably acts as a medium for transferring the light. The whole thickness (total thickness) of the insulating film 7A is preferably about 10000 nm or less, like the first embodiment.

[Method for Manufacturing Light Emitting Device]

A method for manufacturing the light emitting device according to the second embodiment of the present invention can be performed in substantially the same way as that of the first embodiment except for formation of the side surface of the light emitting element mounted, and formation of the insulating film. A method for manufacturing the light emitting device, including manufacture of the light emitting element to be mounted, according to the second embodiment of the present invention will be described below with reference to FIG. 3.

(Manufacture of Light Emitting Element: Formation of Nitride Semiconductor, Formation of n-side Contact Region)

In manufacture of the light emitting element 3A, like the first embodiment, the respective layers of the nitride semiconductor 30 are grown on the element substrate 31 (in step S11), and the n-side contact region and the scribe region of such a wafer are etched to expose the n-type semiconductor layer 32 (in step S12).

(Manufacture of Light Emitting Element; Exposure of Chip Side Surface)

The scribe region of the wafer can be etched so as to reach a predetermined depth of the element substrate 31 to completely remove the nitride semiconductor 30 (in step S13). The predetermined depth of the element substrate 31 can be set to a depth exceeding the thickness of at least the element substrate 31 of the light emitting element 3A (chip) finally thinned. At this time, the scribe region can be etched in a tapered shape. By such a process, the light emitting element 3A can have its side surfaces formed as an inclined surfaces upon singulating the wafer into chips. The formation of the following insulating film 7A can cover the lower end of the side surfaces of the light emitting element.

(Manufacture of Light Emitting Element: Formation of Electrode)

Like the first embodiment, the translucent electrode 4, the p-side pad electrode 52, and the n-side pad electrode 51 can be formed on the upper surface of the wafer (in steps S14 and S15).

(Manufacture of Light Emitting Element: Formation of Protective Film and Insulating Film)

The layers included in the multi-layer film serving as the insulating film 7A other than one uppermost layer can be continuously deposited on the entire surface of the wafer by sputtering. The deposited multi-layer film can be etched to be completely removed except for the scribe region. Then, the insulating film serving as the uppermost layer of the insulating film 7A and the protective film 6 can be deposited, and the region of the insulating film (protective film 6) for the pad opening 6h is removed in the same way as in the first embodiment, which completes the wafer (in steps S20 and S16).

(Singulation of Light Emitting Element)

The element substrate 31 can be ground (background) from the backside of the completed wafer into such a thickness that can easily perform dicing (in step S31). The wafer whose backside is ground can be separated by dicing or the like process along the center line of the scribe region (in step S32). Then, the element substrate 31 can be ground from its backside again, and the unetched portion of element substrate 31 can be removed in the scribe region to thereby produce one light emitting element 3A (chip). The thus-obtained light emitting element 3A can have its side surface inclined and its entire side surfaces covered by the insulating film 7A (see FIG. 3).

(Assembly of Light Emitting Device)

In substantially the same way as in the first embodiment, the light emitting device 10A can be formed by mounting the light emitting element 3A (chip) on the wiring board 1, forming the die wires 21 and 22, and then sealing the light emitting element 3A with the seal member 9 (in step S40).

In the above manufacturing method, the formation of the insulating film 7A (in step S20) and the formation of the protective film 6 (in step S16) are continuously performed, which is not limited. Alternatively, the formation of the insulating film 7A may be performed before formation of the pad electrode 5 (before step S15), or before formation of the translucent electrode 4 (before step S14). For example, in the step for forming the side surfaces of the light emitting element 3A (in step S13), after etching the nitride semiconductor 30, the multi-layer film is deposited while the resist mask covering the region other than the scribe regions is being maintained, and the liftoff is performed by removal of a resist, so that the insulating film 7A can be formed to cover the scribe region (side surfaces of the light emitting element 3A). In this case, the etching (in step S12) for exposing the n-type semiconductor layer 32 can be performed only on the n-side contact region. In the step of removing the nitride semiconductor 30 in the scribe region (in step S13), the parts from the n-type semiconductor layer 32 to the p-type semiconductor layer 34 may be removed at one time.

In the light emitting device 10A of the second embodiment, the light emitting element 3A may have its side surfaces formed vertically, like the light emitting element 3 of the light emitting device 10 in the first embodiment. Such a side surfaces may have insulating film 7A coated therewith. The light emitting device 10A may have the structure in which the insulating film 7A does not completely cover up to the lower end of the side surface of the light emitting element 3A, like the light emitting device 10 of the first embodiment. In this case, the backside of the light emitting element 3A may not be ground after the singulation (S32). Alternatively, as described in the first embodiment, the light emitting device 10A may have a multi-layer film, like the insulating film 7A, covering the bottom surface (backside) of the light emitting element 3A.

As mentioned above, the light emitting device of the second embodiment can improve the reliability and easily reduce the size and thickness, like the first embodiment. The light emitting device includes the insulating film between the die wire and the light emitting element in the form of the multi-layer film, so that the light entering the die wires is multi-reflected, which can suppress unevenness in emitted light due to the die wires.

Third Embodiment

In the light emitting devices of the first and second embodiments of the present invention, in order to form the insulating film covering the side surfaces of the light emitting element, it is necessary to deeply etch the scribe region serving as the side surface in the stage of manufacturing the light emitting element (wafer). However, the generally wire-bonding mounting type light emitting element finished as a wafer or chip can also be assembled into the same type of the light emitting device. A light emitting device according to a third embodiment of the present invention will be described below with reference to FIG. 5. The same elements as those of the light emitting devices of the first and second embodiments are designated by the same reference characters, and thus the description thereof will be omitted below.

Figure 5:
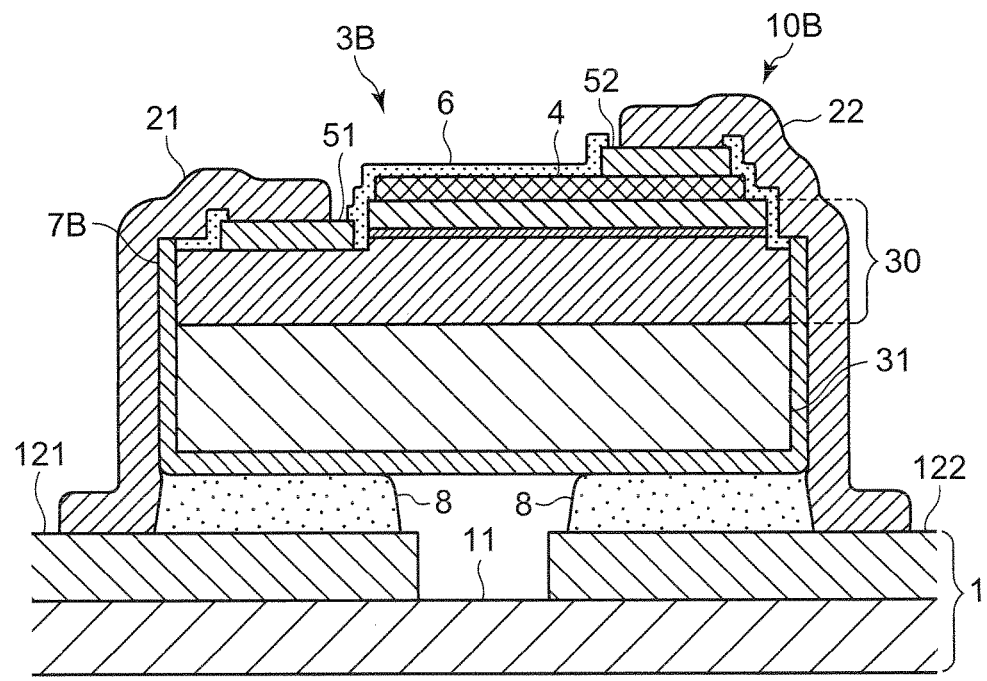
FIG. 5 is a schematic diagram for explaining the structure of a light emitting device according to a third embodiment of the present invention, specifically, a cross-sectional view of a main part of the light emitting device corresponding to the cross-sectional view taken along the line A-A indicated by the arrows of FIG. 2A.

As shown in FIG. 5, alight emitting device 10B in the third embodiment of the present invention includes a light emitting element 3B mounted on the wiring board 1 with the pair of pad electrode 51 and 52 facing upward, and the pad electrodes 51 and 52 are respectively connected to the negative and positive lead electrodes 121 and 122 of the wiring board 1 via the die wires 21 and 22. The light emitting element 3B has substantially the same structure as that of the light emitting element 3A of the second embodiment except for the shape of the side surface of the light emitting element 3B and the insulating film 7B covering not only the side surfaces of the light emitting element 3B but also its bottom surface. That is, the entire structure of the light emitting device 10B has substantially the same as that shown in FIG. 1, and thus the upper surface of the light emitting element 3B is substantially the same as that shown in FIG. 2A.

(Light Emitting Element)

In the light emitting element 3B, the semiconductor structure (element substrate 31, nitride semiconductor 30) and the electrodes (translucent electrode 4, pad electrodes 51 and 52) have substantially the same structure as that of each of the light emitting elements 3 and 3A, and thus the description thereof will be omitted below. The light emitting element 3B in the light emitting device 10B includes the protective film 6 covering only its upper surface except for the pad openings 6h (see FIG. 2A), like the second embodiment, and the insulating film 7B having a multi-layer structure for covering its side surfaces and bottom surface.

(Insulating Film)

Like the insulating film 7A of the second embodiment, the insulating film 7B can be formed by stacking two kinds of dielectric films with different refractive indexes. The material and thickness of the respective dielectric films are substantially the same as those in the second embodiment. Each dielectric film is preferably one that can be deposited by the CVD process at low temperature. The insulating film 7B having the multi-layer film is provided not only its side surfaces of the light emitting element 3B, but its bottom surface, so that the light emitted downward from the light emitting layer (active layer 33) of the light emitting element 3B can be multi-reflected to improve the light extraction efficiency. After singulating the wafer into the light emitting elements 3B by dicing or the like, such an insulating film 7B can be integrally deposited and formed on the side surfaces and backside (bottom surface) of the light emitting element 3B (the details of which will be described in the phrases regarding the manufacturing method). In the light emitting device 10B of this embodiment, like the second embodiment, the entire side surfaces of the light emitting element 3B are covered by the insulating film 7B made of inorganic material. With this arrangement, without bonding the seal member 9 to the light emitting element 3B, which further reduces the degradation of the seal member 9 due to heat or light, improving its durability.

[Method for Manufacturing Light Emitting Device]

In the method for manufacturing the light emitting device in a third embodiment of the present invention, the insulating film is formed after completion of the light emitting element (chip) to be mounted. The method for manufacturing the light emitting device according to the third embodiment, including manufacture of the light emitting element to be mounted, will be described below with reference to FIG. 6.

Figure 6:
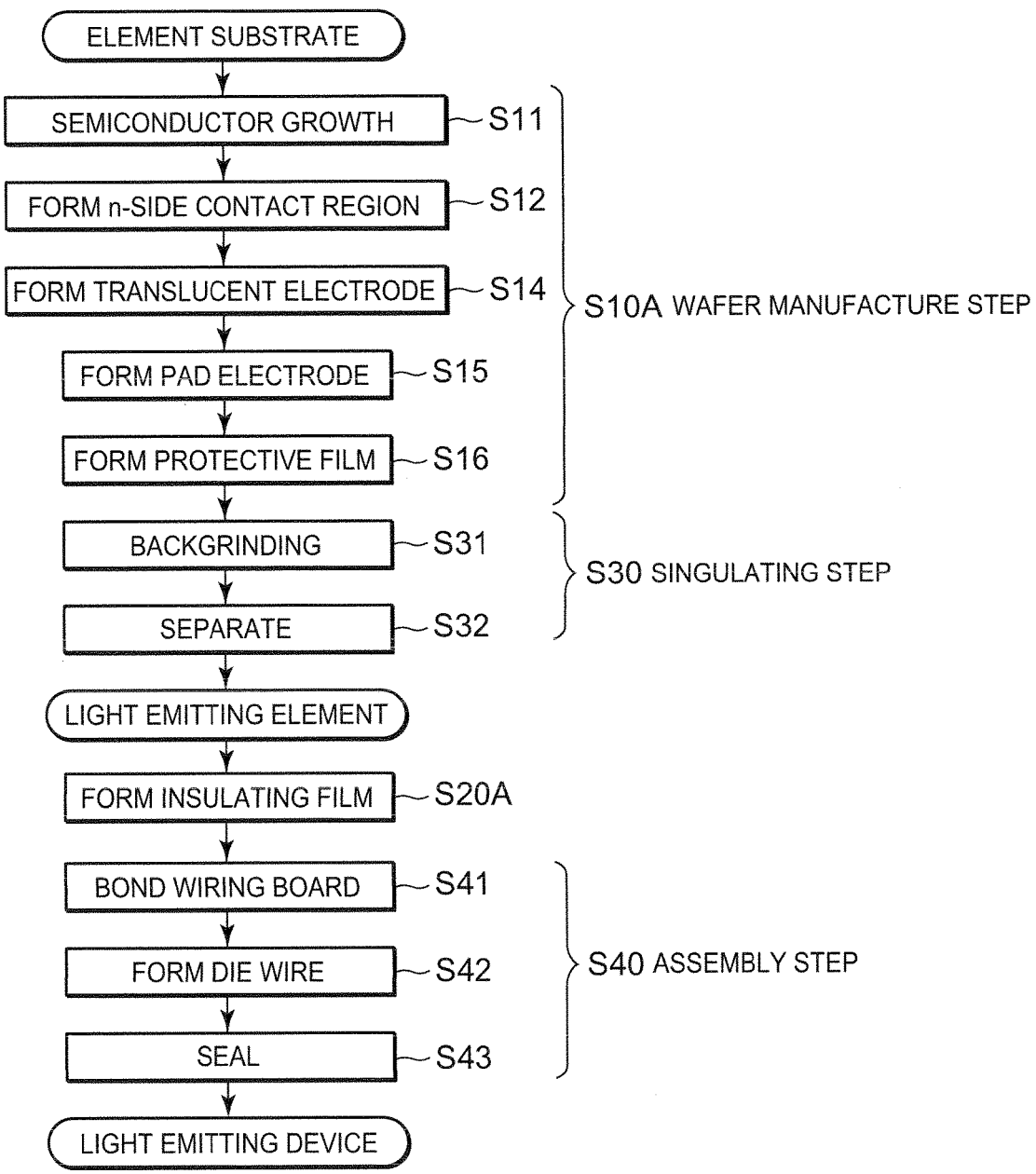
FIG. 6 is a flowchart for explaining a manufacturing method of the light emitting element according to the third embodiment of the present invention.

As shown in FIG. 6, the light emitting device 10B can be manufactured through the following steps: a wafer manufacture step S10A of arranging and coupling the light emitting elements 3B on the element substrate 31 to manufacture a wafer; a singulating step S30 of dividing the wafer into the light emitting elements 3B (chips); an insulating film formation step S20A of forming the insulating film 7B covering the backside (bottom surface) and the side surfaces of the light emitting element 3B; and an assembly step S40 of mounting the light emitting element 3B on the wiring board 1.

The respective steps will be described below.

(Manufacture of Light Emitting Element: Formation of Nitride Semiconductor, Formation of Contact Region for n-Side Electrode)

In manufacture of the light emitting element 3B, like the first and second embodiments, the respective layers of the nitride semiconductor 30 can be grown on the element substrate 31 (in step S11), and the contact region for the n-side electrode and the scribe region of the wafer can be etched to expose the n-type semiconductor layer 32 (in step S12). In this embodiment, etching (in step S13, see FIG. 3) for completely removing the nitride semiconductor 30 in the scribe region of the wafer may not be performed.

(Manufacture of Light Emitting Element: Formation of Electrode and Protective Film)

Like the first embodiment, the translucent electrode 4, and the p-side and n-side pad electrodes 52 and 51 can be formed on the upper surface of the wafer (in steps S14 and S15). Further, like the first embodiment, the insulating film serving as the protective film 6 is deposited, and the region of the insulating film for the pad openings 6h (see FIG. 2A) can be removed to form the protective film 6 (in step S16), leading to the completion of the wafer.

(Singulation of Light Emitting Elements)

The element substrate 31 can be ground (subjected to backgrinding) from the backside of the completed wafer into such a small thickness that can easily perform dicing (in step S31). The thus-obtained wafer with its backside ground can be divided by dicing or the like along the center line of the scribe region (in step S32) to obtain one light emitting element 3B (chip). In the light emitting element 3B obtained, the insulating film (protective film 6) covers only on the upper surface (surfaces on which the pad electrodes 51 and 52 are formed), hereinafter referred to as a "pad electrode formation surface") of the light emitting element 3B. At the side surfaces (end surfaces) of the light emitting element 3B exposed by the dicing, the nitride semiconductor 30 and the element substrate 31 are exposed.

(Formation of Insulating Film)

The light emitting elements 3B (chips) can be arranged at certain intervals with its pad electrode formation surface facing downward by being bonded to a support substrate, such as an adhesive sheet having the heat resistance for manufacture of the semiconductor element. The layers of a multi-layer film forming the insulating film 7B can be continuously deposited on the light emitting element 3B (chip) fixed to the support substrate with the bottom surface (element substrate 31) of the light emitting element 3B facing upward by the low-temperature CVD process, such as ECR plasma CVD (in step S20A). Thus, the bottom surface and side surfaces of the light emitting element 3B, that is, the nitride semiconductor 30 and the element substrate 31 exposed can be completely covered with the insulating film 7B.

The support substrate for grinding the element substrate (in step S31) being bonded to the pad electrode formation surface of the wafer may be maintained during dicing of the wafer from its backside (in step S32). The respective singulated light emitting elements 3B (chips) can be arranged by a distance for a dicing margin and fixed to on the support substrate with its bottom surface (element substrate 31) facing upward, whereby the insulating film 7B can be deposited without replacing the support substrate with the chip bonded thereto by another support substrate. The transfer steps of the wafer or chip (such as cutting, dicing, and bonding and peeling of the adhesive sheets in respective processes for deposition of the insulating film) can be minimized to prevent the breakage of the light emitting elements and to improve the workability.

(Assembly of Light Emitting Device)

In the same way as in the first and second embodiments, the light emitting element 3B (chip) can be mounted on the wiring board 1 (in step S41), forming the die wires 21 and 22 (in step S42), and then sealing the light emitting element 3B with the seal member 9 (in step S43), which leads to the completion of the light emitting device 10B.

The light emitting device 10B of the third embodiment may be provided with an insulating film as a single layer, in place of the insulating film 7B formed of the multi-layer film, like the light emitting device 10 of the first embodiment. In the light emitting device 10B, the light emitting element 3B has its bottom surface covered with the insulating film 7B. Therefore, the element substrate 31 may be a conductive substrate such as GaN substrate or the like. Alternatively, the element substrate 31 may be completely removed. In order to completely remove the element substrate 31 in the light emitting element 3B, the element substrate 31 can be removed from the nitride semiconductor 30, for example, by laser liftoff (LLO), instead of grinding. This is the same way when the multi-layer film is provided at the bottom surface of the light emitting element 3 or 3A in the light emitting device 10 or 10A of the first or second embodiment. In case when the nitride semiconductor 30 in the scribe region is completely removed before the singulating step (from the wafer), the light emitting elements 3 or 3A can be singulated at the same time as the removing process of the element substrate 31.

When forming a multi-layer film at the bottom surface of the light emitting element 3 or 3A, the multi-layer film may be formed before the singulation (in step S32) (that is, after cutting or removing the element substrate 31) or after the singulation. For example, when the multi-layer film (insulating film 7B) is formed at the bottom surface of singlated the light emitting element 3 having its side surfaces formed vertically, the protective film 6 and the insulating film 7B are stacked on the side surfaces of the light emitting element 3. In this way, the light emitting element mounted on the light emitting device in the embodiments of the present invention may be provided with an insulating region continuously extending at least a part of a region from its side surface to its bottom.

As mentioned above, like the second embodiment, the light emitting device of the third embodiment can not only improve its reliability, but also suppress unevenness in emission of light due to the die wire to thereby improve the light extraction efficiency. Further, the light emitting device can also be easily manufactured using the wire-bonding mounting type light emitting element (chip).

The light emitting devices 10, 10A, and 10B of the first to third embodiments (hereinafter collectively referred to as the "light emitting device 10") include the light emitting element 3 (3A, 3B) with a pair of pad electrodes 51 and 52, but can mount a large-sized light emitting element including, for example, two or more n-side and p-side pad electrodes. In such a light emitting device, the respective pad electrodes may be connected to different points of the negative and positive lead electrodes 121 and 122 by individually forming the die wires from the respective surfaces of the pad electrodes.

In the light emitting element 3 (3A, 3B) mounted on the light emitting device of the embodiments of the present invention, the connection of the pad electrodes 51 and 52 to the translucent electrode 4, the n-type semiconductor layer 32, and the die wires 21 and 22 have low resistance. As to the pad electrodes 51 and 52, the conditions for the arrangement on the upper surface of the light emitting element 3, shape (area), thickness, and adhesiveness to the wire in the conventional wire bonding is not required. The p-side pad electrode 52 may be omitted and the die wire 22 may also be connected directly to the translucent electrode 4.

In the light emitting device 10 of each of the first to third embodiments, the face-up mounting type light emitting element 3 is mounted with all electrodes placed at its upper surface (light radiation surface).

The light emitting device of an aspect of the present invention can also mount an opposite electrode type light emitting element in which electrodes are placed at an upper surface and a lower surface of the light emitting element. The light emitting device of the embodiment of the present invention can mount, for example, a laser diode (LD), in addition to a light emitting diode (LED).

The light emitting devices 10 of the embodiments have the seal members 9 in a substantially domed shape, that is, in the form of convex lens disposed on the wiring board 1, but the present invention is not limited thereto. In the light emitting device, for example, a frame (frame body) may be formed along a circle enclosing the light emitting element 3 on the wiring board 1, and a translucent resin material may be filled the frame body and then hardened to form the seal member 9. By this forming method, the seal member 9 can be formed to have any appropriate planar shape according to the shape of the frame body. The seal member 9 can also be formed using resin material having a low viscosity. In this case, the seal member can also be formed to have a flat surface, or a concave surface (concave lens-like shape). The frame body can be formed of material having a high reflectance, allowing the light emitted toward the side from the light emitting element to be reflected, which can produce the light emitting device with the high light extraction efficiency. The frame body can be first molded into the shape of the frame body, and then bonded to the upper surface of the wiring board 1. However, like the seal member 9, preferably, a liquid or paste-like material can be provided and molded on the wiring board 1, and then solidified. Such materials for the frame body include phenol resin, epoxy resin, BT resin, silicon resin, as a thermosetting resin, and PPA (polyphthalamide) as a thermoplastic resin. In order to increase the reflectance of the frame body, white silicon resin obtained by adding white fillers made of a titanium oxide or the like to the silicon resin is preferably used.

The light emitting device 10 of the above embodiments use the film-like FPC having flexibility as the wiring board 1, but the present invention is not limited thereto. Any package that can be mounted by the wire bonding can be used. For example, a chip on board (COB) package may be used in which a pattern of a lead electrode is formed of a metal film on a flat plate-like base. Alternatively, a ceramic package for a surface-mounted light emitting device may be used in which a pattern of a lead electrode is formed of a metal film at the bottom surface of a casing. In above embodiments, the light emitting device 10 employs the wiring board 1 on which the negative and positive lead electrodes 121 and 122 face the light emitting element 3 to be mounted, but the present invention is not limited thereto. The light emitting element can also be bonded only to one of the lead electrodes, or directly to the base. In such a light emitting device, the die wire may extend from the side surface (surface of the insulating film) of the light emitting element to the region provided with the lead electrode via the surface of the base. Alternatively, for example, the die wire and the lead electrode can be integrally formed of the conductive ink (see fourth and fifth embodiments to be mentioned below).

The light emitting device of the embodiments of the present invention may be a large-sized surface light emitting device including a plurality of light emitting elements, for example a plurality of light emitting elements mounted and arranged in a matrix in a COB package. In such a light emitting device, the pad electrodes of the adjacent light emitting elements may be connected by the die wire. Particularly, the light emitting device of the embodiments of the present invention does not require a space for bonding (connecting) the bonding wire to both sides of the light emitting element, and thus can be a light emitting device that can emit a large amount of light per area by arranging the light emitting elements with a small distance therebetween.

Fourth Embodiment

As mentioned above, the lead electrode of the wiring board can be formed of the conductive ink. In the light emitting device of the embodiment of the present invention, the lead electrode can be formed of the conductive ink at the same time as the die wire. A light emitting device according to a fourth embodiment of the present invention will be described below with reference to FIG. 7. The same elements as those of the light emitting device of the first to third embodiments are designated by the same reference characters, and thus the description thereof will be omitted below.

As shown in FIG. 7, a light emitting device 10C in a fourth embodiment of the present invention includes the light emitting element 3 mounted on a flat plate-like base 11A with a pair of pad electrodes 51 and 52 facing upward, and die wires 21A and 22A extending from the respective pad electrodes 51 and 52 through the side surfaces of the light emitting element 3 to the surface of the base 11A and then to the outside (transversely in FIG. 7) of the light emitting element 3 in the plan view. The die wire 21A (22A) can be a negative lead electrode 121 (positive lead electrode 122) on the surface of the base 11A. That is, in the light emitting device 10C, the die wire 21A (22A) and the negative lead electrode 121 (positive lead electrode 122) can be integrally formed together. The light emitting device 10C can be the surface light emitting device in which the light emitting elements 3 are arranged and mounted in the COB package.

FIG. 7 shows an enlarged view of one light emitting element 3.

(Light Emitting Element)

The light emitting element 3 mounted on the light emitting device 10C has the substantially same structure as the light emitting device 10 (see FIG. 2) of the first embodiment except that a part of its side surface (n-type semiconductor layer 32) is an inclined surface. The members of this embodiment which are the same as those of the first embodiment are designated by the same reference characters. As described in the first embodiment, such a light emitting element 3 can be manufactured by etching in the second etching process (for removal of the n-type semiconductor layer 32) in the scribe region of the wafer. As shown in FIG. 2B, the light emitting device 10C can mount the light emitting element 3 having its side surface vertically formed, and also can mount the light emitting element 3A and 3B mounted on the light emitting devices 10A and 10B of the second third embodiment.

(Base)

The wiring board 1A applied to the light emitting device 10C can includes the flat plate-like base 11A and the negative and positive lead electrodes 121 and 122 formed on the surface of the base. The wiring board 1A can be completed by forming the negative and positive lead electrodes 121 and 122 together with the die wires 21A and 22A which is conducted after mounting the light emitting element 3 on the base 11A serving as the base of the wiring board 1A. The base 11A may be a flexible film, like the base 11 of the wiring board 1 in the first embodiment. However, the base 11A is preferably formed of insulating material having some strength and which is difficult to deform so as not to break the wiring at the boundary between the light emitting element 3 and the base 11A (end of the lower surface of the light emitting element 3) due to the continuous formation of the die wire 21A (22A) and the negative lead electrode 121 (positive lead electrode 122). The base 11A is preferably formed of material having a low light transmittance which makes it difficult for light emitted from the light emitting element 3 or outside light to pass therethrough. Specifically, suitable materials for the base include ceramics ($Al_2O_3$, AlN, and the like), and resins, such as phenol resin, epoxy resin, polyimide resin, bismaleimide triazine resin (BT resin), polyphthalamide (PPA), and the like.

(Lead Electrode, Die Wire)

The negative lead electrode 121 and positive lead electrode 122 of the wiring board 1A are integrally formed with the die wire 21A (22A). That is, the negative lead electrode 121 (positive lead electrode 122) is formed of conductive material that can be continuously formed on the upper surface of the base 11A, the side surfaces of the light emitting element 3 mounted on the base 11A and the pad electrodes 51 and 52 on the upper surface of the light emitting element 3, together with the die wire 21A (22A).

Suitable conductive materials include a conductive ink, like the die wires 21 and 22 of the light emitting device 10 in the first embodiment.

(Bonding Member)

The light emitting element 3 of the light emitting device 10C can be bonded directly to the base 11A via a bonding member 8A bonded to the entire bottom of the light emitting element 3. Alternatively, like the light emitting device 10 of the first embodiment, two conductive bonding members 8 may be separately bonded to the base 11A (see FIG. 2B). The bonding member 8A is preferably formed of material having good heat dissipation property and adhesion of the bottom surface (element substrate 31) of the light emitting element 3 and the base 11A.

[Method for Manufacturing Light Emitting Device]

A method for manufacturing the light emitting device according to a fourth embodiment of the present invention can be performed in substantially the same way as that of the first embodiment except for the shape of the formed die wire. The method for manufacturing a light emitting device according to the fourth embodiment will be described below with reference to FIG. 3. The light emitting element to be mounted is the same as the light emitting element of the first embodiment, and thus manufacturing processes up to the singulating step (through steps S10 to S30) will be omitted below.

(Assembly of Light Emitting Device)

The light emitting element 3 (chip) can be fixed to the base 11A by the bonding member 8A (in step S41).

Then, by the ink-jet method, the die wire 21A can be formed to extend from the region of the surface of the base 11A for the negative lead electrode 121 to on the pad electrode 51 via the side surface of the light emitting element 3, and the die wire 22A is formed to extend from on the pad electrode 52 to the region of the surface of the base 11A for the positive lead electrode 122 via the side surface of the light emitting element 3 (in step S42). The process can discharge the conductive ink, for example, while moving the ink jet head from the left to the right sides in FIG. 7 (while moving the base 11A leftward with the light emitting element 3 mounted thereon). Then, the light emitting element 3 is sealed by the seal member 9 (in step S43) to produce the light emitting device 10C.

In the light emitting device 10C of the fourth embodiment, the light emitting element 3 is bonded to the substrate without the lead electrodes (substrate formed only of abase 11), and then the lead electrodes are formed together with the die wires. However, the light emitting element 3 may be bonded to the surface of the base (region where the lead electrode is not formed) of the wiring board previously provided with the lead electrodes. That is, the wiring board can also be applied in which a distance d between the negative and positive lead electrodes is larger than a length L of the light emitting element 3 (d>L). In this case, the die wire is formed from the side surface of the light emitting element 3 coupled to the base (surface of the insulating film 7) to the surface of the base, and extends on the base up to on the lead electrode (see the fifth embodiment to be mentioned below).

As mentioned above, the light emitting device according to the fourth embodiment can easily manufacture by using the wire-bonding mounting type light emitting element (chip) and the substrate (base) without wirings, in the same way as the first embodiment.

Fifth Embodiment

As mentioned above, the light emitting element mounted on the light emitting device of the present invention is not limited to have the same pad electrode structure as that of the wire-bonding mounting type light emitting element mentioned in the first embodiment. For example, in order to suitably form the die wire by the ink jet method, the arrangement or shape of the pad electrodes may be modified. The light emitting device of the embodiments of the present invention can use the wiring board suitable for mounting the light emitting element on one of the negative and positive lead electrodes. A light emitting device according to a fifth embodiment of the present invention will be described below with reference to FIG. 8. The same elements as those of the light emitting device of the first to fourth embodiments are designated by the same reference characters, and thus the description thereof will be omitted below.

Figure 8:
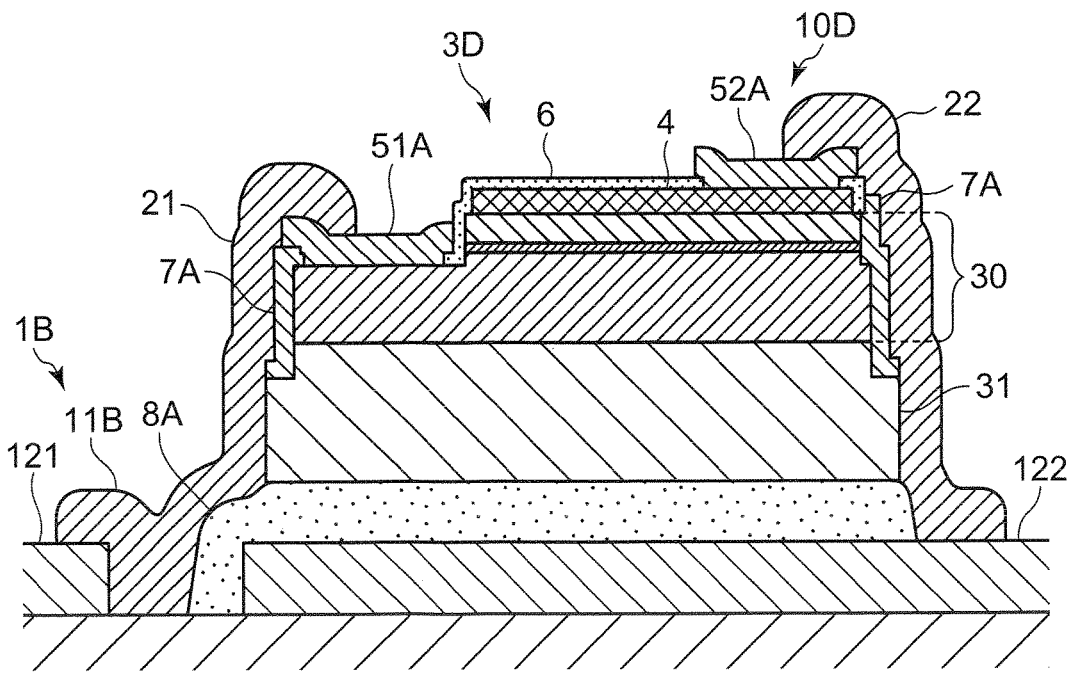
FIG. 8 is a schematic diagram for explaining the structure of a light emitting device according to a fifth embodiment of the present invention, specifically, a cross-sectional view of a main part of the light emitting device corresponding to the cross-sectional view taken along the line A-A indicated by the arrows of FIG. 2A.

As shown in FIG. 8, a light emitting device 10D in the fifth embodiment of the present invention includes a light emitting element 3D mounted on the wiring board (substrate) 1B with the pair of pad electrode 51A and 52A positioned as an upper surface, so that the pad electrodes 51A and 52A are respectively connected to the negative and positive lead electrodes 121 and 122 of the wiring board 1B via the die wires 21 and 22, and the light emitting element 3D is sealed with the seal member 9 (see FIGS. 1 and 2B). The light emitting device 10D is, for example, a light emitting device having the light emitting element 3D mounted in the ceramic package. FIG. 8 shows an enlarged view of the upper surface of the wiring board 1B as the bottom surface of a recessed portion of the ceramic package which is a case for a light emitting element.

(Wiring Substrate)

The wiring board 1B applied to the light emitting device 10D includes a base 11B and negative and positive lead electrodes 121 and 122 formed on the surface of the base, like the wiring board 1 in the first to third embodiments. As shown in FIG. 8, in the wiring board 1B, the positive lead electrode 122 is disposed on the entire mounting region for the light emitting element 3D, and the negative lead electrode 121 is disposed spaced apart from the positive lead electrode 122 and the light emitting element 3D. In this embodiment, the n-side die wire 21 is not connected directly to the negative lead electrode 121 from side surface of the light emitting element 3D, but is formed on the surface of the base 11B, like the die wire 21A of the light emitting device 10C in the fourth embodiment (see FIG. 7). Thus, the base 11B is preferably formed of insulating material having some strength which make difficult to deform such that the die wire 21 is not broken at the boundary between the light emitting element 3D and the base 11B, like the base 11A of the light emitting device 10C.

(Bonding Member)

In the light emitting device 10D, the wiring board 1B is provided with the positive lead electrode 122 facing the entire bottom surface of the light emitting element 3D. In order to insulate from the n-side die wire 21, the light emitting element 3D is bonded by insulating bonding member 8A. As shown in FIG. 8, the bonding member 8A can be provided to cover the region from the entire bottom surface of the light emitting element 3D to the end surface of the positive lead electrode 122 facing the negative lead electrode 121. The bonding member 8A is preferably formed of material having good heat dissipation property and adhesion, like the fourth embodiment.

(Light Emitting Element)

The light emitting element 3D has substantially the same structure as that of the light emitting element 3 mounted on the light emitting device 10 (see FIG. 2) in the first embodiment except for the shape of the pad electrodes 51A and 52A, and the structures of the protective film 6 and the insulating film 7 (7A). That is, in the light emitting element 3D, the semiconductor structure (element substrate 31, nitride semiconductor 30) and the translucent electrode 4 have substantially the same structure as that of the light emitting element 3, and thus the description thereof will be omitted below. The light emitting element 3D has substantially the same shape of each side surface as that of the light emitting element 3. However, the light emitting element 3D includes the protective film 6 covering its upper surface of the light emitting element 3D, and the insulating film 7A having a multi-layer film structure covering the side surfaces thereof, like the light emitting device 10A of the second embodiment.

The n-side pad electrode 51A and the p-side pad electrode 52A of the light emitting element 3D can be overhung toward both ends of the light emitting element 3D on its upper surface. The pad electrodes 51A and 52A can be provided on the insulating film 7A and the protective film 6 such that the overhang portions do not come into contact with the nitride semiconductor 30. The pad electrodes 51A and 52A are connected to the n-type semiconductor layer 32, and the p-type semiconductor layer 34 (translucent electrode 4) via the pad openings 6h (see FIG. 2A), respectively. That is, the light emitting element 3D can be manufactured by forming the translucent electrode 4 (in step S14 of FIG. 3), depositing the protective film 6 and the insulating film 7A, forming the pad opening 6h (in steps S16 and S20 of FIG. 3), and forming the pad electrodes 51A and 52A (in step S15 of FIG. 3) in that order. The respective steps are substantially the same as those in the manufacturing methods for the light emitting devices 10 and 10A of the first and second embodiments.

In the light emitting device 10D, the pad electrodes 51A and 52A are formed in the above shape, so that the die wires 21 and 22 are connected to the pad electrodes 51A and 52A in the vicinity of the peripheral edge of the upper surface of the light emitting element 3D. The die wires 21 and 22 can be formed by the ink jet method without discharging any conductive ink on the upper surface of the light emitting element 3D (see manufacturing method of the first embodiment), which can suppress the emitted light from being interrupted by the unnecessary attachment of the conductive ink to the light emitting element 3D.

The light emitting device 10D in the fifth embodiment may be provided with a single-layer insulating film 7 integrally with the protective film 6 in the same way as the light emitting device 10 of the first embodiment, instead of the insulating film 7A, or may be provided with the insulating film 7B at the bottom and side surfaces of the light emitting element 3D in the same way as the light emitting device 10B of the third embodiment. In the light emitting device 10D, the light emitting element 3, 3A, or 3B of any one of the first to third embodiments may be bonded and mounted to the wiring board 1B by the insulating bonding member 8A. The light emitting element 3D mounted on the light emitting device 10D may have its inclined side surfaces, like the light emitting element 3A mounted on the light emitting device 10A (see FIG. 4) of the second embodiment. The light emitting element 3D may be mounted on the wiring board 1 or 1A (base 11A), like the light emitting device 10 or 10C of the first or fourth embodiment (see FIG. 2 or FIG. 7).

As mentioned above, the light emitting device of the fifth embodiment can use the wiring board whose one of the lead electrodes has the light emitting element mounted thereon to improve the reliability, while easily reducing its size and thickness, like the first to third embodiments. The light emitting device of the fifth embodiment may not interrupt the irradiated light because of the smaller amount of unnecessary conductive ink attached to the light emitting element even though the die wire is formed by the ink-jet method.

Sixth Embodiment

In the light emitting device of the fifth embodiment, the pad electrode is disposed in the vicinity of the peripheral edge of the upper surface of the light emitting element, but may be extended along the side surface of the light emitting element to be integral with the die wire. A light emitting device according to a sixth embodiment of the present invention will be described below with reference to FIG. 9. The same elements as those of the light emitting device of the first to fifth embodiments are designated by the same reference characters, and thus the description thereof will be omitted below.

Figure 9A:
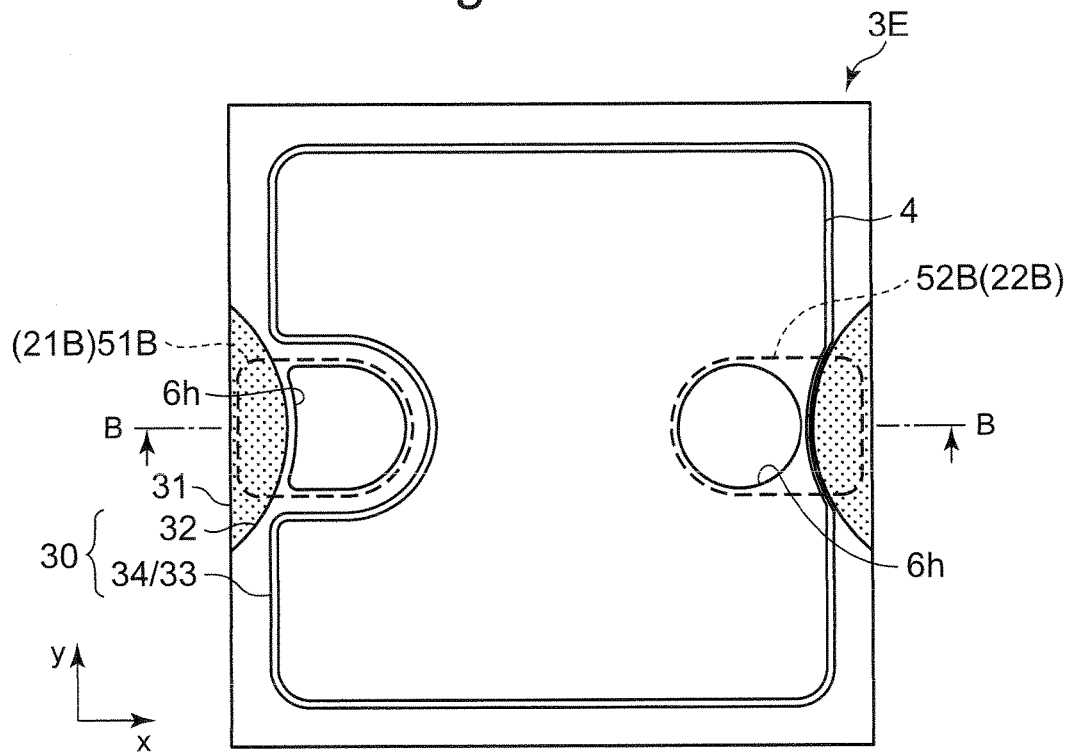

A light emitting device 10E in a sixth embodiment of the present invention has a light emitting element 3E as a light source mounted on the same wiring board 1 (see FIG. 1) as that of the light emitting device 10 of the first embodiment. The light emitting element 3E is connected to the negative and positive lead electrodes 121 and 122 by the die wires (wirings) 21B and 22B which are formed at the light emitting element 3E before mounting. and the conductive bonding members 8B and 8B As shown in FIG. 9, the light emitting element 3E has substantially the same structure as that of the light emitting element 3 mounted on the light emitting device 10 (see FIG. 2) of the first embodiment except for the shape of the side surface of the light emitting element, the shape of the pad electrodes 51B and 52B, and the structure of the protective film 6 (insulating film 7). Specifically, the n-side pad electrode 51B and the p-side pad electrode 52B in the light emitting element 3E extend from the upper surface of the light emitting element 3E toward both ends thereof, and are integrally formed with the die wires 21B and 22B formed on the insulating film 7 covering the side surface of the light emitting element 3E. The light emitting element 3E has the insulating film 7 covering only the regions of the side surfaces thereof where the die wire 21B (n-side pad electrode 51B) and the die wire 22B (p-side pad electrode 52B) are provided. Referring to FIG. 9A, the outlines of the pad electrodes 51B and 52B (die wires 21B and 22B) are represented by a thick broken line.

The die wires 21B and 22B can be integrally formed with the pad electrodes 51B and 52B, respectively. Like the die wires 21 and 22 of the light emitting device in the first to third embodiments, the die wires 21B and 22B can be connected to the pad electrodes 51B and 52B of the light emitting element 3E. Such die wires 21B and 22B can be films formed of metal electrode material by sputtering or the like, like the pad electrodes 51B and 52B. The die wires 21B and 22B can be have a lower resistance than that of each of the die wires 21 and 22 formed of conductive ink containing resin as a binder, and thus can be formed finely (narrowly, thinly). In this embodiment, as shown in FIG. 9A, the die wires 21B and 22B are formed to have substantially the same diameter as that of the pad electrode 51B and 52B on the upper surface of the light emitting element 3E, but the present invention is not limited thereto. Alternatively, the die wire can be formed to decrease its width at the side surface of the light emitting element 3E to suppress the interruption of the light emitted from the light emitting element 3E as much as possible. The die wires 21B and 22B preferably have such a shape that can ensure enough area in connection (contact) with the bonding members 8B. The pad electrodes 51B and 52B integral with the die wires 21B and 22B can be formed after forming the protective film 6 (insulating film 7), like the light emitting element 3D mounted in the light emitting device 10D (see FIG. 8) of the fifth embodiment.

The die wires 21B and 22B can be formed at the same time as the pad electrodes 51B and 52B. That is, the pad electrodes 51B and 52B can be formed in the wafer which a plurality of light emitting elements 3E collectively arranged and coupled together. Thus, when the die wires 21B and 22B are formed to protrude from the side surfaces of the light emitting element 3E to the outside (in the direction x), the light emitting element 3E ensures the scribe region wider than the total thickness of the die wires 21B and 22B, which might result in a small effective region (region having the entire layer of the nitride semiconductor 30) to decrease the light output. Therefore, preferably, in the light emitting element 3E, the nitride semiconductor 30 (n-type semiconductor layer 32) and the element substrate 31 can be removed in the regions for formation of (including the vicinity of) the die wires 21B and 22B as indicated by hatching in FIG. 9A to form recessed portions at the side surfaces of the light emitting element 3E, and the insulating film 7 is covered at the end surfaces (side surfaces) thereof.

Figure 9B:
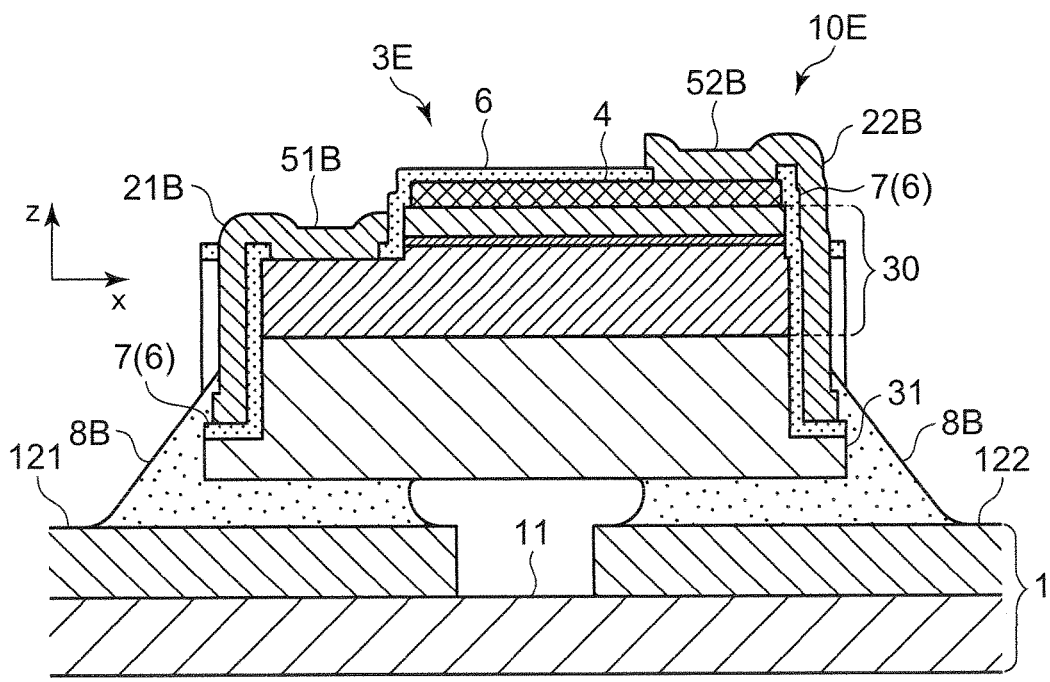

In the light emitting device 10E of this embodiment, since the die wires 21B and 22B are not formed by the ink jet method, the unnecessary conductive ink might not be attached, and thus the entire two side surfaces of the light emitting element 3E (left and right side surfaces shown in FIG. 9) does not need to be insulated. A region of the element substrate 31 in the regions where the die wires 21B and 22B is preferably removed to sufficient thickness (depth) such that the conductive bonding member 8B does not come into contact with the nitride semiconductor 30 exposed at the side surface of the light emitting element 3E. Since the region of the nitride semiconductor 30 to be removed is restricted to a very small space, even though the part of the element substrate 31 is removed deeply, the wafer can be prevented from being broken due to the backside grinding for singulation of the light emitting element 3E (in step S30 of FIG. 3). Alternatively, in the light emitting element 3E, the nitride semiconductor 30 (n-type semiconductor layer 32) and upper parts of the element substrate 31 may be removed even in the scribe region. At this time, preferably, only the regions of the light emitting element 3E in which the die wires 21B and 22B are e removed widely inward in a plan view, and other scribe regions are narrowed to ensure the area of the effective region. As shown in FIG. 9B, the side surfaces (end surfaces) of the light emitting element 3E in the region where the nitride semiconductor 30 is removed are formed vertically. However, concave portions (removed portions) expanding upward may be formed in the light emitting element to form tapered inclined surfaces.

In this embodiment, the die wires 21B and 22B are formed in the wafer manufacture step before singulation, and thus does not reach the lower part of the element substrate 31, that is, the end surface of the substrate to be exposed in the singulation step. This is because when grinding the element substrate 31 from its backside for singulating the light emitting elements 3E, if the substrate 31 is ground up to a height (depth) position where the die wires 21B and 22B are formed, the die wires 21B and 22B might be peeled off. In addition, the die wires 21B and 22B as the metal film may difficult to divide (die, break) together with the element substrate 31 and the nitride semiconductor 30.

As shown in FIG. 9A, the die wire is preferably formed inside the light emitting element 3E without reaching the end (side) of the light emitting element 3E in the plan view from the viewpoint of productivity. In order to mount the light emitting element 3E on the wiring board 1 in the light emitting device 10E, the conductive bonding members 8B, such as solder, forms fillets raising from the bottom to the side surfaces of the light emitting element 3E to be connected to the die wires 21B and 22B spaced apart from the lower surface and side surfaces (end surfaces) of the light emitting element 3E. In other words, in the light emitting device 10E, the die wire 21B (22B) and the bonding member 8B integrally extend toward the left side (right side) of the light emitting element 3E to form the wiring connected to the negative lead electrode 121 (positive lead electrode 122). In assembling the light emitting element 3E on the wiring substrate 1 (in the assembly step S40, see FIG. 3), the light emitting device 10E can perform the assembly including bonding (step S41) and connection (step S42) in one step. Such a mounting process in one step is substantially the same as the flip-chip mounting, but the light emitting element 3E has the die wires 21B and 22B corresponding to the pad electrodes disposed not at the lower surface (mounting surface) but at the two opposed side surfaces to be spaced apart from each other. Thus, the light emitting element 3E may not require the accuracy for positioning with respect to the wiring board 1, which would be required in the flip-chip mounting.

A light emitting device 10E of the sixth embodiment may further form the wiring using the conductive ink, such as the die wires 21 and 22 which are provided in the light emitting device 10 or the like in the first embodiment, without using the conductive bonding member 8B or without depending only on the bonding member 8B for connection of the light emitting element 3E to the negative and positive lead electrodes 121 and 122. Alternatively, in manufacturing the light emitting element 3E, the die wires 21B and 22B are may not be integrally formed with the pad electrodes 51B and 52B, and may be stacked on the pad electrodes 51 and 52 again by sputtering or the like after forming the pad electrode 51 and 52 (51B, 52B) and the protective film 6 (insulating film 7). In the light emitting device 10E, an insulating film 7A (multi-layer film) may cover the side surfaces of the light emitting element 3E instead of the insulating film 7. Alternatively, in the light emitting device 10E, an insulating film (multi-layer film) may cover the bottom surface of the light emitting element 3. In this case, when the insulating film is deposited on the backside of the singulated light emitting element 3E (chip) and the die wires 21B and 22B on the side surfaces thereof might be coated. For this reason, before the singulation (of the wafer), the insulating film is deposited.

The light emitting element 3E mounted on the light emitting device 10E of the sixth embodiment has its bottom surface and the lower part of its side surface continuously extended from the bottom surface which are insulated in the same manner as the light emitting element 3 mounted on the light emitting device 10 of the first embodiment. Like the light emitting device 10D (see FIG. 8) of the fifth embodiment, the light emitting element 3E can be bonded to the wiring board 1B (positive lead electrode 122) by the insulating bonding member 8A, and to be connected by the die wires 21 and 22. Like the light emitting device 10C (see FIG. 7) of the fourth embodiment, the light emitting element 3E may be mounted on the wiring board 1A (base 11A).

As mentioned above, the light emitting device of the sixth embodiment can improve the reliability to easily reduce its size and thickness, like the first to fifth embodiments. The light emitting device of the sixth embodiment may not need to add another step because the die wires are integrally formed with the pad electrodes. The die wire may be formed narrowly because the die wire formed of a metal film has good electrical conductivity, like the pad electrode. The die wire can be formed narrowly to reduce the amount of light emitted from the light emitting element interrupted by the die wire. In the light emitting device, the die wires are formed before mounting the light emitting element, which reduces the number of steps for assembly.

In the light emitting device of the first to fifth embodiments, the die wire is formed by printing the conductive ink. In the light emitting device of the sixth embodiment, the die wire is formed by vapor deposition or sputtering. Alternatively, the die wire can be formed by other methods that coat the side surface of the light emitting element 3 with the conductive material in a desired shape. Specifically, suitable materials for the die wire can include a conductive ink, a vapor deposited film, a plated film, and metal foil which will be bonded thereto by an adhesive.

While the light emitting devices according to the embodiments of the present invention have been described above, the present invention is not limited to the above embodiments. It is apparent that various modifications and changes can be made to the disclosed embodiments based on the above description without departing from the scope of the claims.

10, 10A, 10B, 10C, 10D, 10E Light emitting device
1, 1A, 1B Wiring board (substrate)
11, 11A, 11B Base
121 Negative lead electrode
121a First extending electrode
121b First coupling portion
122 Positive lead electrode
122a Second extending electrode
122b Second coupling portion
21, 21A, 21B Die wire (wiring)
22, 22A, 22B Die wire (wiring)
3, 3A, 3B, 3D, 3E Light emitting element
30 Nitride semiconductor
31 Element substrate
32 n-type semiconductor layer
33 Active layer
34 p-type semiconductor layer
4 Translucent electrode
51, 51A, 51B n-side pad electrode (electrode)
52, 52A, 52B p-side pad electrode (electrode)
6 Protective film
7, 7A, 7B Insulating film
8, 8A, 8B Bonding member
9 Seal member

The invention claimed is:

1. A light emitting device comprising:
a flexible substrate having a negative lead electrode and a positive lead electrode formed on an upper surface thereof;
a light emitting element having a negative electrode and a positive electrode formed on an upper surface thereof, the light emitting element being bonded to the positive lead electrode by an insulating bonding member;
an insulating film formed in contact with side surfaces of the light emitting element;
a first electrically conductive film formed in contact with a first portion of the insulating film and connecting the negative electrode to the negative lead electrode, a portion of the first electrically conductive film being disposed on an upper surface of the negative electrode of the light emitting element; and
a second electrically conductive film formed in contact with a second portion of the insulating film and connecting the positive electrode to the positive lead electrode, a portion of the second electrically conductive film being disposed on an upper surface of the positive electrode of the light emitting element;
wherein the insulating bonding member covers an end surface of the positive electrode.

2. The light emitting device according to claim 1, wherein the insulating film is formed on the side surfaces of the light emitting element in an approximately uniform thickness.

3. The light emitting device according to claim 1,
wherein a connecting portion between the first electrically conductive film and the negative lead electrode is positioned in a vicinity of a lower end of a first side surface of the light emitting element, and
wherein a connecting portion between the second electrically conductive film and the positive lead electrode is positioned in a vicinity of a lower end of a second side surface of the light emitting element.

4. The light emitting device according to claim 1, wherein the insulating film is formed of a translucent inorganic insulating material.

5. The light emitting device according to claim 1, wherein the insulating film is made of a multi-layer film formed by alternately stacking two kinds of dielectric films with different refractive indexes.

6. A light emitting device comprising:
a flexible substrate;
a negative lead electrode formed on an upper surface of the flexible substrate, the negative lead electrode comprising a first coupling portion and a plurality of first extending electrodes, each having one end thereof coupled to the first coupling portion;
a positive lead electrode formed on an upper surface of the flexible substrate, the positive lead electrode comprising a second coupling portion and a plurality of second extending electrodes, each having one end thereof coupled to the second coupling portion, the second extending electrode being positioned adjacent to the first extending electrode with a predetermined distance therebetween;
a plurality of light emitting elements, each having a positive electrode and a negative electrode on an upper surface thereof, each negative electrode being connected to a first extending electrode, and each positive electrode being connected to a second extending electrode;
an insulating film formed on side surfaces of each of the light emitting elements;
a first electrically conductive film formed on a first portion of the insulating film of each light emitting element and connecting the negative electrode of each light emitting element to a respective first extending electrode, a portion of the first electrically conductive film being disposed on an upper surface of the negative electrode of each light emitting element; and
a second electrically conductive film formed on a second portion of the insulating film of each light emitting element and connecting the positive electrode of each light emitting element to a respective second extending electrode, a portion of the second electrically conductive film being disposed on an upper surface of the positive electrode of each light emitting element, wherein each light emitting element is bonded to a respective second extending electrode by an insulating bonding member, each insulating bonding member covering an end surface of the respective second extending electrode, and wherein the first extending electrodes and the second extending electrodes are alternately arranged.

7. The light emitting device according to claim 6, wherein the flexible substrate has a rectangular shape having a short side and a long side, and the light emitting elements are arranged in a row in a direction along the long side of the flexible substrate.

8. The light emitting device according to claim 6, wherein, in each of the light emitting elements, the insulating film is formed on the side surfaces of the light emitting element in an approximately uniform thickness.

9. The light emitting device according to claim 6, wherein, in each of the light emitting elements, a connecting portion between the first electrically conductive film and the negative lead electrode is positioned in a vicinity of a lower end of a first side surface of the light emitting element, and wherein, in each of the light emitting elements, a connecting portion between the second electrically conductive film and the positive lead electrode is positioned in a vicinity of a lower end of a second side surface of the light emitting element.

10. The light emitting device according to claim 6, wherein the insulating film of each of the light emitting elements is formed of a translucent inorganic insulating material.

11. The light emitting device according to claim 6, wherein the insulating film of each of the light emitting elements is made of a multi-layer film formed by alternately stacking two kinds of dielectric films with different refractive indexes.

12. The light emitting device according to claim 6, wherein, in each of the light emitting elements, a thickness of the first and second electrically conductive films is in a range of about 10 to 20 μm.

13. The light emitting device according to claim 6, where an entirety of each of the first extending electrodes extends linearly inward from the first coupling portion, and an entirety of each of the second extending electrodes extends linearly inward from the second coupling portion.

14. The light emitting device according to claim 6, wherein the first extending electrodes and the second extending electrodes are alternately arranged such that longitudinal sides of the first extending electrodes are adjacent to longitudinal sides of the second extending electrodes.

15. A light emitting device comprising:

a substrate;

a negative lead electrode formed on an upper surface of the substrate, the negative lead electrode including a first coupling portion and a plurality of first extending electrodes, each having one end thereof coupled to the first coupling portion;

a positive lead electrode formed on an upper surface of the substrate, the positive lead electrode including a second coupling portion and a plurality of second extending electrodes, each having one end thereof coupled to the second coupling portion, the second extending electrodes being positioned adjacent to the first extending electrodes with a predetermined distance therebetween;

a plurality of light emitting elements each having a positive electrode and a negative electrode on an upper surface thereof, each light emitting element being bonded to a respective second extending electrode by an insulating bonding member, each insulating bonding member covering an end surface of the respective second extending electrode;

an insulating film formed on side surfaces of each of the light emitting elements;

a first electrically conductive film formed on a first portion of the insulating film of each light emitting element and connecting the negative electrode of each light emitting element to a first extending electrode, a portion of the first electrically conductive film being disposed on an upper surface of the negative electrode of each light emitting element; and a second electrically conductive film formed on a second portion of the insulating film of each light emitting element and connecting the positive electrode of each light emitting element to a second extending electrode, a portion of the second electrically conductive film being disposed on an upper surface of the positive electrode of each light emitting element, wherein the first extending electrodes and the second extending electrodes are alternately arranged.

16. The light emitting device according to claim 14, wherein the substrate is a flexible substrate.

17. The light emitting device according to claim 14, where an entirety of each of the first extending electrodes extends linearly inward from the first coupling portion, and an entirety of each of the second extending electrodes extends linearly inward from the second coupling portion.

18. The light emitting device according to claim 14, wherein the first extending electrodes and the second extending electrodes are alternately arranged such that longitudinal sides of the first extending electrodes are adjacent to longitudinal sides of the second extending electrodes.

* * * * *

UNITED STATES PATENT AND TRADEMARK OFFICE
CERTIFICATE OF CORRECTION

| | |
|---|---|
| PATENT NO. | : 9,905,741 B2 |
| APPLICATION NO. | : 14/191604 |
| DATED | : February 27, 2018 |
| INVENTOR(S) | : Takahiro Oyu |

It is certified that error appears in the above-identified patent and that said Letters Patent is hereby corrected as shown below:

In the Claims

Column 36, Line 39 Claim 16:
Please replace "claim 14" with --claim 15--.

Column 36, Line 41 Claim 17:
Please replace "claim 14" with --claim 15--.

Column 36, Line 46 Claim 18:
Please replace "claim 14" with --claim 15--.

Signed and Sealed this
Third Day of July, 2018

Andrei Iancu
*Director of the United States Patent and Trademark Office*